US009209966B1

(12) United States Patent
Hossain et al.

(10) Patent No.: US 9,209,966 B1
(45) Date of Patent: Dec. 8, 2015

(54) CLOCK RECOVERY CIRCUIT

(71) Applicant: Rambus Inc., Sunnyvale, CA (US)

(72) Inventors: Masum Hossain, Edmonton (CA); Jared L. Zerbe, Woodside, CA (US); Myeong-Jae Park, Seoul (KR)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/687,766

(22) Filed: Apr. 15, 2015

Related U.S. Application Data

(63) Continuation of application No. 14/050,202, filed on Oct. 9, 2013, now Pat. No. 9,036,764.

(60) Provisional application No. 61/734,687, filed on Dec. 7, 2012.

(51) Int. Cl.
*H03D 3/24* (2006.01)
*H04L 7/033* (2006.01)
*H04L 7/00* (2006.01)
*H04L 25/03* (2006.01)
*H03L 7/091* (2006.01)

(52) U.S. Cl.
CPC .............. *H04L 7/0331* (2013.01); *H03L 7/091* (2013.01); *H04L 7/0025* (2013.01); *H04L 7/0087* (2013.01); *H04L 25/03146* (2013.01); *H04L 2025/03445* (2013.01)

(58) Field of Classification Search
CPC ....... H04L 7/033; H04L 1/205; H04L 25/068; H03L 7/091; H03L 7/087; H03L 7/0891; H03L 2207/06; H03L 7/10; H03L 7/0805; H03L 7/089

USPC .......... 375/355, 371, 373, 374, 376; 327/155, 327/156, 157
See application file for complete search history.

(56) References Cited

U.S. PATENT DOCUMENTS

| 5,867,544 | A | 2/1999 | Taniguchi |
| 5,937,020 | A | 8/1999 | Hase et al. |
| 5,990,714 | A | 11/1999 | Takahashi |
| 6,211,741 | B1 | 4/2001 | Dalmia |
| 6,553,089 | B2 | 4/2003 | Huh et al. |
| 6,580,304 | B1 | 6/2003 | Rieven |

(Continued)

OTHER PUBLICATIONS

Behzad Razavi, "Monolithic Phase-Locked Loops and Clock Recovery Circuits, Theory and Design,"., IEEE Press, 1994, pp. 33-35. 4 pages.*

(Continued)

*Primary Examiner* — Tesfaldet Bocure
(74) *Attorney, Agent, or Firm* — Marc P. Schuyler

(57) ABSTRACT

This disclosure provides a clock recovery circuit having a phase-locked loop (PLL) with two-point modulation. A binary phase-error signal controls a variable frequency oscillator's (VFO's) feedback path, while a linear phase-error signal controls the PLL outside of that feedback path. The linear phase-error signal is injected using an ultra-low latency delay path. While the binary phase-error signal sets the lockpoint of the PLL, the linear phase-error path dominates at high frequencies and also helps reduce dither jitter. Other optional features include an area-efficient hybrid phase detector that generates both the binary and linear phase-error signals, use of a phase interpolator inside the PLL to further smooth dither jitter, recovered clock update filtering for specific data transitions, and support for multi-PAM signaling.

23 Claims, 7 Drawing Sheets

(56) References Cited

U.S. PATENT DOCUMENTS

| | | |
|---|---|---|
| 6,617,936 B2 | 9/2003 | Dally et al. |
| 6,630,868 B2 | 10/2003 | Perrott et al. |
| RE38,482 E | 3/2004 | Leung et al. |
| 6,704,383 B2 | 3/2004 | Lee et al. |
| 6,861,916 B2 | 3/2005 | Dally et al. |
| 6,914,465 B2 | 7/2005 | Kiyose et al. |
| 6,950,956 B2 | 9/2005 | Zerbe et al. |
| 7,058,150 B2 | 6/2006 | Buchwald et al. |
| 7,471,691 B2 | 12/2008 | Black et al. |
| 8,135,104 B2 | 3/2012 | Kim et al. |
| 8,699,649 B2 | 4/2014 | Byun |
| 2002/0037065 A1 | 3/2002 | Nakamura |
| 2002/0105386 A1 | 8/2002 | Shastri |
| 2003/0025539 A1 | 2/2003 | Fiscus |
| 2003/0035502 A1 | 2/2003 | Boerker |
| 2003/0053576 A1 | 3/2003 | Cao |
| 2003/0103591 A1 | 6/2003 | Noguchi |
| 2004/0052323 A1 | 3/2004 | Zhang |
| 2004/0141577 A1 | 7/2004 | Brunn et al. |
| 2004/0223575 A1 | 11/2004 | Meltzer et al. |
| 2005/0231249 A1 | 10/2005 | Tani |
| 2006/0250192 A1 | 11/2006 | Hsieh |
| 2007/0001713 A1 | 1/2007 | Lin |
| 2007/0171968 A1 | 7/2007 | Frnaz |
| 2008/0212730 A1 | 9/2008 | Tang et al. |
| 2009/0028281 A1 | 1/2009 | Chulwoo et al. |
| 2012/0106689 A1 | 5/2012 | Byun |
| 2012/0307874 A1 | 12/2012 | Hamano et al. |

OTHER PUBLICATIONS

Altera, "White Paper: FPGAs at 40 nm and >10 Gbps: Jitter-, Signal Integrity-, Power-, and Process-Optimized Transceivers," Apr. 2009, Ver. 1.0. 39 pages.

Aoyama et al., "3Gbps, 5000ppm Spread Spectrum SerDes PHY with Frequency Tracking Phase Interpolator for Serial ATA," NEC Electronics Corporation, 2003 Symposium on VLSI Circuits Digest of Technical Papers. 4 pages.

Chakraborty, Kanad, "Bisramgen: A Silicon Compiler for Built-In Self-Repairable Random-Access Memories," University of Michigan, The Sciences and Engineering, vol. 58-02B, 1997. 145 pages.

Emami-Neyestanak et al., "CMOS Transceiver with Baud Rate Clock Recovery for Optical Interconnects," Computer Systems Lab., Stanford, CA, Jun. 17-19, 2004. 4 pages.

Gursoy et al., "Design and Realization of a 2.4 Gbps—3.2 Gbps Clock and Data Recovery Circuit Using Deep-Submicron Digital CMOS Technology," SOC Conference, 2003, Proceedings, IEEE International Systems-on-Chip, Mar. 2003. 4 pages.

Hogge et al., "A Self Correcting Clock Recovery Circuit," J. of Lightwave Tech., vol. LT-3, No. 6, Dec. 1985. 5 pages.

Jalali, Mohammad Sadegh, "A Hybrid Phase-Locked Loop for Clock and Data Recovery Applications," Master of Applied Science Thesis, Aug. 2010. 165 pages.

Kim et al., "A 1.0-Gbps Clock and Data Recovery Circuit with Two-XOR Phase-Frequency Detector," Department of Electrical and Computer Engineering, Inha Univ., Inchon, Korea. Aug. 6, 2002. 4 pages.

Kim et al., "Adaptive Supply Serial Links With Sub-1-V Operation and Per-Pin Clock Recovery," IEEE J. of Solid-State Circuits, vol. 37, No. 11, Nov. 2002. 11 pages.

Larsson, Patrick, "A 2-600-MHz CMOS Clock Recovery PLL with Low-V dd Capability," IEEE Journal of Solid-State Circuits, vol. 34 No. 12, Dec. 1999. 10 pages.

Lee et al., "Paper 18.4: Improving CDR Performance via Estimation," 2006 IEEE International Solid-State Circuits Conference, Feb. 7, 2006. 8 pages.

Lee et al., "Burst Mode Packet Receiver Using a Second Order DLL," 2004 Symposium on VLSI Circuits Digest of Technical Papers. 4 pages.

Lee, Hae-Chang, "An Estimation Approach to Clock and Data Recovery," Thesis for the Department of Electrical Engineering of Stanford University, Nov. 2006. 122 pages.

Lee et al., "A Second-Order Semi-Digital Clock Recovery Circuit Based on Injection Locking," ISSCC 2003 Session 4, Clock Recovery and Backplane Transceivers Paper 4.3. 8 pages.

Lee et al., "A 155-Mhz Clock Recovery Delay- and Phase-Locked Loop," pp. 421-430, Reprinted from IEEE Journal of Solid-State Circiuts, vol. SC-27, pp. 1736-1745, Dec. 1992. 10 pages.

Li et al., "A New Hybrid Phase Detector for Reduced Lock Time and Timing Jitter of Phase-Locked Loops," Analog Integr Circ Sig Process, 2008, published online Jun. 17, 2008, pp. 233-240. 8 pages.

Nielsen et al., "A Fully Integrated 43.2-Gb/s Clock and Data Recovery and 1:4 demux IC in InP HBT Technology," IEEE Journal of Solid-State Circuits, vol. 38, Issue 12, Dec. 2003, pp. 2341-2346. 6 pages.

Ren et al., "Performance Analysis of Edge-Based DFE," IEEE 15th Topical Meeting on Electrical Performance of Electronic Packaging, Scottsdale, AZ, Oct. 23, 2006, pp. 265-268. 4 pages.

Sidiropoulos et al., "SA20.2: A Semi-Digital DLL with Unlimited Phase Shift Capability and 0.08-400MHz Operating Range," Center for Integrated Systems, Stanford University, Stanford, CA, Feb. 1997, mos.stanford.edu/papers/ss_1sscl_97.pdf. 10 pages.

Sidiropoulos et al., "A Semidigital Dual Delay-Locked Loop," IEEE Journal of Solid-State Circuits, vol. 32, No. 11, Nov. 1997, pp. 1683-1692. 10 pages.

Song et al., "A Delay Locked Loop Circuit With Mixed-Mode Tuning," Department of Electrical and Computer Engineering, Inha University, Inchon, Korea, Sep. 2000. 4 pages.

Song et al., Delay Locked Loop Circuit with Mixed Mode Phase Tuning Technique, IEICE Trans. Fundamentals, vol. E83-A, No. 9, Sep. 2000. 3 pages.

Toifl et al., "0.94ps-rms-Jitter 0.016mm$^2$ 2.5GH Multi-Phase Generator PLL with 360 (degree) Digitally Programmable Phase Shift for 10Gb/s Serial Links," 2005 IEEE International Solid-State Circuits Conference, Digest of Technical Papers, pp. 334-335, 410-411, 334-335, and 667, Feb. 10, 2005. 5 pages.

Wong et al., "A 27-mW 3.6-Gb/s I/O Transceiver," IEEE Journal of Solid-State Circuits, vol. 39, No. 4, pp. 602-612, Apr. 2004. 11 pages.

\* cited by examiner

CLOCK RECOVERY CIRCUIT

This patent application is a continuation of U.S. Utility application Ser. No. 14/050,202, filed on Oct. 9, 2013 for "Clock Recovery Circuit" which, in turn, claims benefit to U.S. Provisional Application No. 61/734,687, filed Dec. 7, 2012, also for "Clock Recovery Circuit." The aforementioned applications are hereby incorporated by reference herein in their entirety.

This disclosure relates to a clock recovery circuit that uses a phase-locked loop to recover a timing signal from a data signal. More particularly, this disclosure relates to a clock recovery circuit that simultaneously generates a binary phase-error signal and a linear phase-error signal and applies these to control a PLL (phase-locked loop) at two different control points.

BACKGROUND

Clock recovery circuits are used in high-speed receivers to recover timing information from an incoming data signal. A basic clock recovery circuit 101 implemented as part of an integrated circuit (IC) is illustrated in FIG. 1. Digital information in the incoming data signal arrives at a signaling pin 103 of the IC. The digital information is often encoded to ensure a minimum transition density needed for clock recovery. The clock recovery circuit 101 generates a recovered clock from the incoming data signal, which is then fed over a feedback path 105 to an input of the clock recovery circuit. Both the feedback path and the incoming data signal are compared by a phase detector 109, which determines whether the recovered clock signal is early or late relative to the incoming data signal. Phase difference information from the phase detector is passed through a filter 113 and accumulated to control a charge pump 115. In turn, the charge pump 115 generates a control signal for a variable frequency oscillator (VFO) 117, which advances or delays frequency and phase of the recovered clock in order to align its edges with the incoming data signal. This structure implements a phase-locked loop (PLL) that, over time, closely aligns the recovered clock with phase and frequency of the incoming data signal. An offset circuit 106 creates a phase-shifted copy of the recovered clock to generate a sampling clock, used to align a data sampler 107 to the midpoint of a data interval. In some cases the offset circuit 106 is an integral part of VFO 117. As indicated by reference numeral 111, the data sampler 107 can itself be a part of the phase detector 109, with a single circuit 111 used for both clock and data recovery.

Conventional clock recovery designs such as depicted in FIG. 1A are often rooted in a form of binary phase detector known as a "bang-bang" or Alexander phase detector. Comprised of relatively simple logic, a bang-bang phase detector identifies logic state transition between successive digital symbols and takes an "edge sample" exactly at the expected transition time. If the recovered clock is precisely aligned with the transition edges of the data signal (discounting intersymbol interference), the edge sample should be exactly at the voltage midpoint between logic states. However, depending on direction of transition, an edge sample offset from the midpoint means the edge sampling clock is early or late relative to the data signal. This early and late information is used to incrementally advance or retard the recovered clock to align it with the transitions in the incoming data signal.

Binary phase detectors are advantageous in that they typically use simple logic and are well suited for power-efficient digital clock recovery designs. However, designs based on these circuits are often characterized by large steady state dithering and low bandwidth, due to high-loop latency attributable to filtering of up and down binary signals and converting these signals into a VFO control signal.

By contrast, linear phase detection techniques result in a phase-error signal proportional to the difference between an incoming data signal and a recovered clock, and these techniques therefore promise significantly lower steady state dither jitter at higher loop bandwidth. However, linear phase detection techniques often suffer from large static phase error and unreliable operation at high frequencies; they are also difficult to combine with digital filtering techniques. To elaborate, conventional linear phase detection techniques generate variable-width pulse signals that gate pull-up and pull-down of a signal line to generate a VFO control signal. Manufacturing variations, capacitive effects, and other issues make it difficult to match precisely these impedances so as to reliably avoid unintended static phase offset. In addition, as the data rates increase, it becomes correspondingly difficult to generate suitable variable-width pulses, i.e., these pulse-widths and associated processing should be of high precision and should be relatively short when compared to a unit interval (which is difficult at higher speeds). As implied earlier, processing typically requires (a) only generating clock recovery updates when there is a transition in the incoming data signal, (b) correctly correlating early or late transitions with a leading or lagging recovered clock, and (c) applying low pass filtering so as to minimize the effects of random noise. Specific filtering requirements become more complex for non-conventional signaling techniques, such 4-PAM signaling.

What is needed is an improved high-bandwidth clock recovery architecture that is area and power efficient and that provides reduced static phase error and dither jitter. Such an architecture would be well-suited to increasingly-small digital designs and digital designs that are power sensitive. Ideally, such an architecture would combine benefits of conventional binary phase detection and linear phase detection techniques while omitting their respective disadvantages. Further still, such an architecture ideally would accommodate non-traditional signaling techniques, such as multi-PAM (MPAM) signaling. The present invention addresses these needs and provides further, related advantages.

BRIEF DESCRIPTION OF THE DRAWINGS

FIG. 9 is depicted in a manner facilitating discussion of transfer characteristics of a PLL that implements principles from this disclosure.

Figure 1:
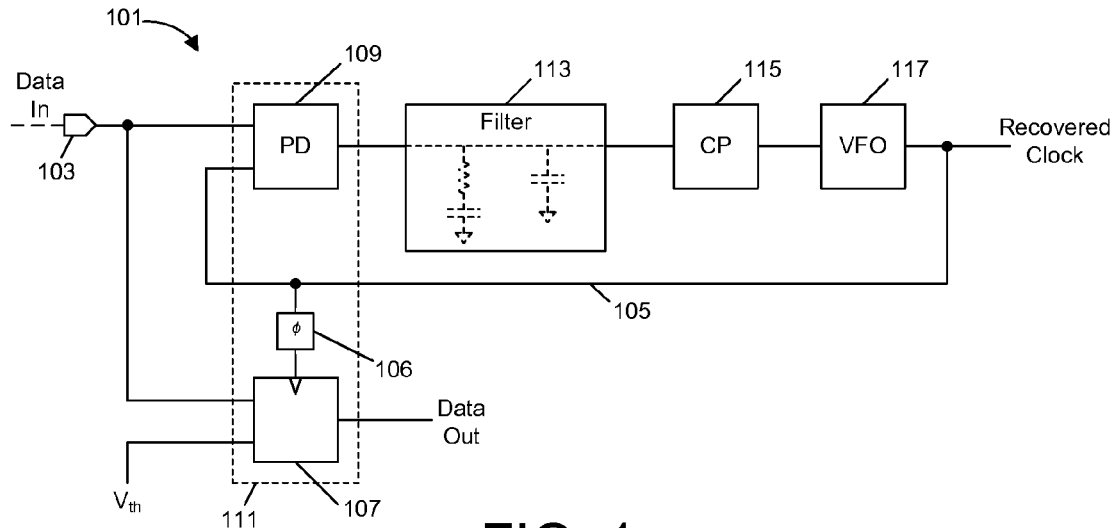
FIG. 1 shows a basic clock recovery circuit 101.

The subject matter defined by the enumerated claims may be better understood by referring to the following detailed description, which should be read in conjunction with the accompanying drawings. This description of one or more particular embodiments, set out below to enable one to build and use various implementations of the technology set forth by the claims, is not intended to limit the enumerated claims, but to exemplify their application to certain methods and devices. The description set out below exemplifies (i) a clock recovery circuit that uses two-point control of a phase-locked loop (PLL), (ii) an integrated circuit having one or more such clock recovery circuits, and (iii) related methods, systems and devices. While the specific examples are presented, the principles described herein may also be applied to other methods and devices as well.

DETAILED DESCRIPTION

Embodiments presented herein use two-point modulation of a phase-locked loop (PLL) to obtain low jitter, high-bandwidth tracking. More specifically, a binary phase-error signal is used to set the lock point of the PLL. A linear phase-error signal is used as part of a fast-response path that both extends the bandwidth of the PLL and smoothes dither jitter in the recovered clock (which otherwise might be attributable to use of the binary phase-error signal). The use of the binary path helps avoid the static phase offset mentioned earlier, and the use of the linear path helps avoid dither jitter.

In more specific embodiments, binary phase detection techniques are applied to generate an "up/down" signal. This up/down signal is accumulated and filtered, and used to set the operating point of a variable frequency oscillator (VFO). A modified linear phase detection technique is also applied to generate an error signal that varies linearly in its magnitude (instead of pulse width). The linear phase-error signal can thus efficiently be applied to adjust the operating point of the VFO, e.g., by simply summing it (or a scaled version of the linear phase-error signal) with a VFO control signal. This approach offers an ultra-low latency path that both extends the PLL's operating range and smooths dither jitter as described.

Several further techniques can optionally be employed to enhance high-bandwidth, low jitter tracking of an incoming data signal.

First, instead of simply integrating the binary phase-error signal to set a VFO operating point, the binary phase-error signal is applied to an interpolator to control phase selection of a feedback clock in a PLL feedback path; the interpolator receives multiple phases of the recovered clock, drawn directly from various resonant stages of the VFO. Because the interpolator's output is passed through the feedback path (e.g., through phase detector comparison with a reference, a low pass filter, a charge pump and the VFO), dither jitter is effectively smoothed, i.e., quantization noise arising from stepped phase selection is partially averaged out. Employed in connection with fast-loop linear phase detection techniques, this structure provides for high-bandwidth clock recovery while at the same time providing low static phase offset and dither jitter compared to conventional structures.

Second, in some embodiments, a timing reference signal can be used to initialize clock recovery to a frequency close to the expected timing of an inbound data signal. This structure helps avoid large initial phase offset and associated difficulty and delay in acquiring frequency lock. Some embodiments therefore use at least two phase detectors, i.e., a first phase detector to compare the recovered clock with the timing reference signal, and at least one second phase detector one to compare the recovered clock with the incoming data signal. This at least one second phase detector includes in one embodiment separate linear and binary phase detector circuits.

Third, instead of using separate linear and binary phase detector circuits, clock recovery circuit footprint can also be improved using a novel hybrid phase detector that uses common components (i.e., common circuitry) to generate each of the binary phase-error and linear phase-error signals. That is, in such an embodiment, the at least one second phase detector referred to in the last paragraph can comprise a single hybrid phase detector circuit.

Fourth, a second order correction circuit can be used to respond to binary phase-error (and effectively respond to both binary phase-error and the integral of binary phase-error), to provide for faster accumulation if the binary phase detection path fails to adequately-track the incoming data signal. Note that additional techniques can also be used, such as a third- or higher-order correction circuit. Advantageously, a delta-sigma modulator and accumulator are used to accumulate (and consequently low pass filter) phase error adjustments before passing them on (e.g., to the phase interpolator).

Fifth, a linear phase-error signal with magnitude that varies with phase difference between the input signal and the recovered clock can be generated using a variety of techniques. In one embodiment, sample-and-hold techniques are used to generate a phase-error signal having a voltage magnitude that directly represents sampled voltage relative to an expected transition voltage midpoint. In yet another embodiment, integration techniques can be used to generate a phase-error signal having a voltage magnitude that varies dependent on time when transition voltage of the incoming data signal exactly equals a reference voltage (e.g., such as the expected midpoint voltage associated with a logic level transition) relative to an expected time. For example, a circuit can start integration dependent on a recovered clock and can stop or sample a result of integration when the incoming data signal matches a reference voltage (e.g., a zero crossing), or viceversa. In one embodiment, a circuit uses a large RC time constant relative to recovered clock period, such that a capacitor can be used to integrate and hold a voltage representing offsets in frequency and phase between the recovered clock and the incoming data signal. Other methods and circuits can also be used to generate a linear-phase error signal with magnitude that varies dependent on phase difference.

Additional options will become clear from the discussion below. Importantly, by providing a highly-digital design with low footprint, high tracking bandwidth and low jitter, the techniques provided by this disclosure allow for enhanced clock recovery at faster data rates, i.e., consistent with the requirements of newer, emerging with circuit designs and signaling standards.

In many designs discussed herein, it should be assumed that a clock recovery circuit is part of a receiver on an integrated circuit (IC). An incoming data signal is received via a signaling lane, via one or more pins or pads (or other "conductive elements") of the IC. The incoming data signal is fed to the clock recovery circuit to recover a timing signal representing transmit timing used to originally launch the incoming data signal (and thus having an exact relationship to individual data symbols of the incoming data signal). This timing signal is then used to determine sampling instants for the incoming data signal, to extract the data symbols conveyed by that signal by sampling at exactly the right time. In many embodiments, each data symbol consists of a single bit, but some embodiments, each data symbol consists of multiple bits. In one embodiment, there is a single "lane" of digital information only (i.e., a single distinct incoming symbol sequence), and in other embodiments, there are 2, 4, 8, 16, 32 or a different number of such lanes in parallel, with the IC having a receiver and a dedicated clock recovery circuit to extract a recovered clock for the respective lane. In yet another design variation, plural lanes of this sort are used, but with one or more lanes put into a low-power mode after initial lock; in the low-power mode, the clock recovery circuit of one lane acts as a master, while the clock recovery circuits for one or more of the other lanes act as slaves. That is, each slave lane tracks "binary path" phase updates from the master lane while preserving relative phase separation. More features and advantages relating to these techniques will become apparent from the discussion below.

Before proceeding with additional detail regarding specific embodiments, it would be helpful to introduce some terms used in this disclosure. First, "binary phase detection" and generation of a "binary phase-error signal" refer to phase detection where a first signal (e.g., an incoming or input data signal) is compared with a recovered clock, and where an "up" or "down" (or "up/down") signal is generated to indicate a positive or negative difference between these two. The up/down signal is typically agnostic as to the magnitude of any phase difference between the signals, i.e., it simply indicates whether edges of the incoming data signal lead or lag edges of the recovered clock signal. A specific example of a binary phase detector is a "bang-bang" or Alexander phase detector. Second, a "charge pump" refers to a circuit that converts an input (e.g., up/down signals from phase detection, or other commands to relatively increase or decrease output frequency) into a signal representing the accumulated input (e.g., integrating all accumulated up/down signals and providing a magnitude-based drive signal for the variable frequency oscillator). The term "charge pump" is used to encompass circuits with either analog or digital outputs, irrespective of supply voltage or current. "Linear phase detection" refers to techniques that generate phase-error signals that indicate magnitude of phase deviation relative to an incoming data signal. Generation of an error signal that "varies linearly with phase error" refers to a phase detection technique where a signal has a variable magnitude that correlates with the amount of phase difference between the two signals; for example, a larger magnitude indicates a larger phase difference. Note that magnitude as used in the context of this definition can have different expressions, including voltage, current, a digital number, or other signal characteristics. Many different techniques can be used to convey relative magnitude. An "integrated circuit," as used herein, refers to a die, packaged or unpackaged. A "lane" refers to a signal path for a flow of a distinct set of digital symbols; depending on implementation, a lane can include one or several conductors. For example, a differential signal conventionally is carried by a single "lane" but by two conductors, with digital data being represented by difference between voltage carried by the respective conductors (e.g., bits are indicated according to whether difference the conductors is positive or negative). "2-PAM" (pulse amplitude modulation) refers to binary signaling, that is, where there are two different binary values that each symbol can have, while "M-PAM" refers to signaling that uses more than two different value-conveying levels of each symbol. For example, a "4-PAM" signal uses four voltage levels to convey 2 bits of information simultaneously, ordered as a most-significant bit (MSB) and a least-significant bit. A "variable frequency oscillator" (VFO) refers to an oscillator that controllably generates a timing signal to have different frequency dependent on input; conventionally, a VFO is often referred to as a voltage-controlled oscillator (VCO), but there are also current-controlled and other forms of variable frequency oscillators. A "clock recovery circuit" as used herein is a circuit that recovers timing from an incoming data signal; a "clock and data recovery circuit" (CDR) as used herein includes a clock recovery circuit as well as a circuit (e.g., a sampler or comparator) that produces data samples using a recovered clock (i.e., a sampling clock). Note that a CDR is an example of a clock recovery circuit. A "signal" refers without limitation to a discrete electrical signal, as well as distinct digital value with a dedicated purpose or destination within a circuit; for example, the writing of two different values computed by software and into respective registers would represent two respective signals. Finally, a "recovered clock" is a timing signal that is generated in dependence on timing of an incoming data signal, typically by a circuit that attempts to correlate occurrence of the timing signal's edges with edges in the incoming data signal. As should be apparent, this definition does not require that the timing signal and the incoming data signal have the same frequency. A recovered clock can exist in many forms, such as an edge-sampling clock, a data-sampling clock, a phase vector passed to a phase interpolator, a serial data word-framing signal or, indeed, another form of timing signal.

It was earlier mentioned that some conventional clock recovery designs suffer from high steady state dither jitter and low tracking bandwidth. The use of two-point modulation of a clock recovery circuit's PLL addresses these issues by using high-bandwidth, linear phase-error correction both to drive VFO output at very high frequency and to smooth and otherwise filter dither jitter attributable to the use of a binary phase detector. Note that while it is possible to use a binary phase detector other than a bang-bang (or Alexander) phase detector, it should be assumed in many of the embodiments discussed below that a bang-bang phase detector is used, or alternatively, that a hybrid phase detector is used which generates a binary phase-error signal similar to that generated by a bang-bang phase detector. Note once again that in many embodiments presented below, the binary phase-error correction is applied to effectively vary delay in the PLL's feedback path (e.g., by changing phase of the feedback signal), while linear phase-error correction is injected outside of this path, in a manner unencumbered by latency of the binary response feedback path.

Figure 2A:
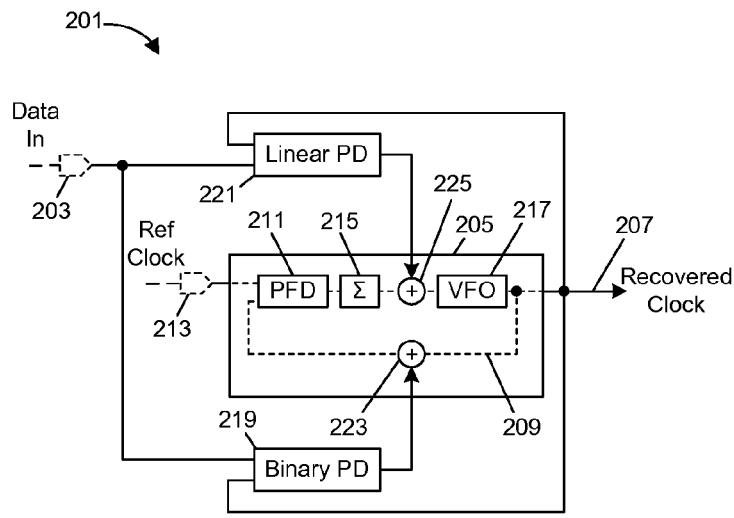
FIG. 2A shows a clock recovery circuit 201 embodying principles of this disclosure; this clock recovery circuit 201 simultaneously uses both binary (e.g., bang-bang) and linear phase-error signals to recover the timing signal, with two-point modulation of a PLL (phase-locked loop) 205.

FIG. 2A is a diagram of a clock recovery circuit 201 that implements techniques drawn from this disclosure. A clock recovery circuit 201 receives an incoming data signal "Data In," for example, as received at an external pin, pad or other conductive element 203 of an IC. The clock recovery circuit 201 also includes a phase-locked loop (PLL) 205, which is controlled by the clock recovery circuit so as to align edges of a recovered clock 207 with transitions of the incoming data signal. The PLL uses a variable frequency oscillator (VFO 217) to generate the recovered clock, and the PLL feeds this recovered clock back to a phase frequency detector (PFD) 211 along a feedback path 209. Binary phase-error information is injected along the feedback path 209 between the VFO 217 and the PFD 211 in order to vary phase (or equivalently, delay) of the feedback signal. In this regard, PFD 211 compares a timing reference signal with the feedback signal, and generates a difference signal. Note that the timing reference signal can be internally generated by the clock recovery circuit using an on-board oscillator (e.g., an oscillator within the IC) or an external source external to the IC (e.g., received at a signaling pin or pad 213). As mentioned previously, the use of a timing reference signal that is a clock waveform "close to" the expected bit rate of the signaling path helps avoid large initial frequency offset, and it speeds convergence on true signal timing. Differences between the timing reference signal and the feedback signal are passed to an accumulator 215, which converts these differences into a variable magnitude control signal. The variable magnitude control signal governs frequency generated by the VFO 217.

Reflecting on the operation discussed thus far, when the clock recovery circuit 201 is initialized, the recovered clock assumes the frequency of the timing reference signal (e.g., as received at an optional signaling pin or pad 213). Phase detection begins tracking difference between the incoming data signal and the recovered clock. Responsive to these differences, the magnitude of the VFO control signal is adjusted, causing the VFO to increase or decrease its frequency to converge with the highest frequency represented by edges of the incoming data signal. As mentioned previously, results of binary phase detection (219) and linear phase detection (221) are each injected as respective binary and linearly varying phase-error signals at injection points 223 and 225, to control the timing signal generated by the VFO 217. Note that while each injection point 223 and 225 is depicted in this Figure as a summing junction, in the context of FIG. 2A, this is meant to denote control points or injection points, that is, that the phase-error signals are used at these points to manipulate the PLL feedforward and feedback paths as appropriate. The output of binary phase detection 219 provides an up/down signal that causes the recovered clock to converge to neutralize offset between the recovered clock and the incoming data signal. The output of linear phase detection 221 is provided as a variable magnitude signal that adjusts the magnitude of the VFO control signal originating from accumulator 215, i.e., at injection point 225. Unencumbered by latency of the feedback path 209, and formatted in a manner where phase-error signal magnitude (e.g., voltage) varies directly with phase error, the output of linear phase detection 221 provides a fast response loop that smoothes dithering that might otherwise arise from injection of the binary phase-error signal. Note that binary and linear phase detection blocks 219 and 221 are each referenced in FIG. 2A as functions; each function can option-ally be implemented as a dedicated circuit. For example, binary phase detection 219 can be implemented as a bang-bang or Alexander phase detector, while linear phase detection 221 can be implemented as a Hogge detector. Other circuits can also be used which produce binary and linear phase-error signals as described. Importantly, in some embodiments shown below, binary phase detection 219 and linear phase detection 221 are performed together by a single circuit, i.e., a hybrid phase detector circuit.

Figure 2B:
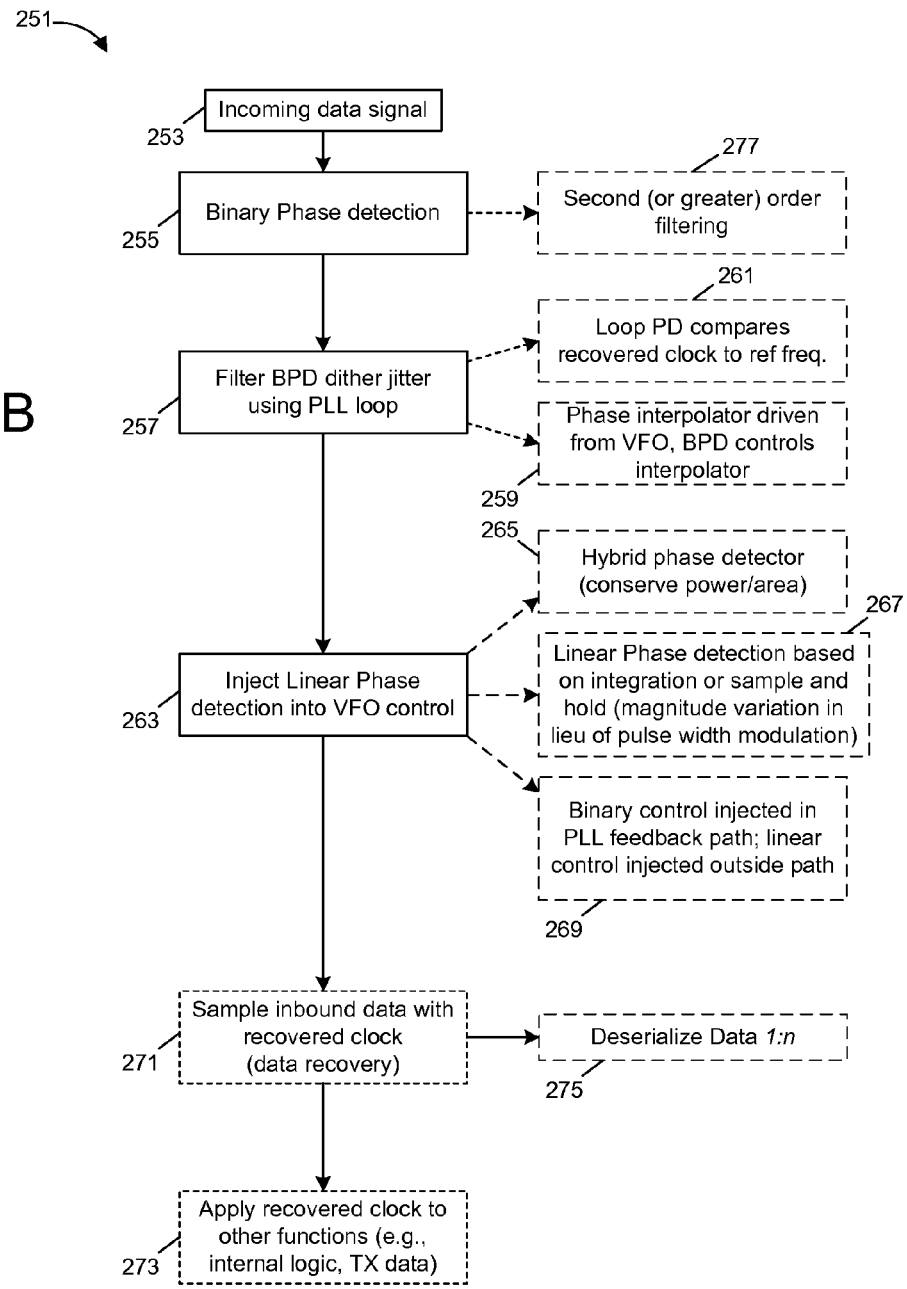
FIG. 2B is a flow chart 251 illustrating some of the principles of this disclosure.

FIG. 2B provides a flow chart 251 that illustrates some of the principles taught by this disclosure. As indicated by numerals 253 and 255, binary phase detection (BPD) techniques are used to generate a recovered clock signal from an incoming data signal. Dither jitter attributable to the binary phase-error signal is partially filtered using the loop of the PLL, as indicated by function block 257. As indicated by dashed-line (optional feature) block 259, this filtering is facilitated by using the binary phase-error signal so as to control a phase interpolator, which in turn is driven by phase-spaced timing outputs from a variable frequency oscillator (VFO). Note that in a traditional bang-bang clock recovery circuit, a phase interpolator output would typically be directly used to sample the incoming data; this produces phase dithering at the recovered clock output due to the nature of the up/down phase code changes. However, if the phase interpolator is instead in the feedback path as conceptually represented by FIG. 2B, phase dithering appears at the PLL output after being shaped by the PLL's low pass phase transfer characteristics. Therefore, dithering jitter is significantly reduced. In addition, per block 261, a starting reference frequency can be used to avoid a large initial frequency offset (and associated difficulty in closing such an initial offset).

Linear phase detection techniques are also used to control the VFO, as indicated by function block 263. Here also, optional techniques may be used to enhance this operation. For example, instead of using two phase detectors (e.g., one phase detector producing a binary phase-error signal, such as a produced by a bang-bang phase detector, and another phase detector producing a linear phase-error signal), a single hybrid phase detector may be used, per feature block 265. The use of a hybrid phase detector provides for a very simple digital implementation, adding little footprint or power consumption above and beyond a conventional bang-bang phase detector. Note that FIGS. 4A and 4D, discussed below, present specific hybrid phase detector designs. Also, instead of using linear phase-error signals that rely on generating variable-width pulses, linear phase detection techniques can optionally be predicated on an integration or a sample-and-hold design, per feature block 267; that is, linear phase detection can be structured such that magnitude of the linear phase-error signal varies directly with amount of offset between edges of the incoming data signal and the recovered clock signal. The logic associated with this type of control is relatively simple and is reliable at very high frequency operation, thus promoting higher tracking bandwidth than conventional clock recovery designs. Once again, FIGS. 4A and 4D, discussed below, present specific hybrid phase detector designs that use these techniques. As indicated by feature block 275, the binary error signal is optionally injected into the PLL's low-latency feedback path 209, while the linear error signal is injected outside of this feedback path, that is, in a manner substantially unencumbered by PLL latency. Finally, as an additional option, the binary phase-error signal can be filtered, for example, using second order techniques, per numeral 277. This is to say, binary phase-error signals can be effectively accumulated with two different weightings depending on whether phase-adjustments cause the recovered clock to "keep up" with transitions in the incoming data signal. Other types of filtering can also be used, such as third-order techniques (such as for example, as is helpful for spread spectrum clocking). Other techniques can also be used.

The two-point modulation of the PLL results in a recovered clock with high tracking bandwidth and low jitter across the entire bandwidth of the recovered clock. As indicated by optional feature blocks 271, 273 and 275, the recovered clock can be applied to other circuitry of the receiver IC. For example, the recovered clock can be used to time sampling of the incoming data signal or to retime inbound data for use by the receiving integrated circuit. The recovered clock can also be applied to operations other than receive timing, for example, to time internal operations of the IC (e.g., to time internal logic or memory operations) or to time transmission of outbound data. As another example, the recovered clock can be applied to a deserializer, to convert serial data received over one or plural inbound lanes to words of parallel data each having a specific number of bits. In such an implementation, the recovered clock can be used to generate timing for word framing, to assist domain-crossing operations, or for another purpose. In each case, the techniques described above can be used to adjust any phase of recovered clock or derived timing, i.e., such that each such clock irrespective of phase or frequency relationship to the output of the VFO tracks phase and frequency movements of VFO output.

Figure 3A:
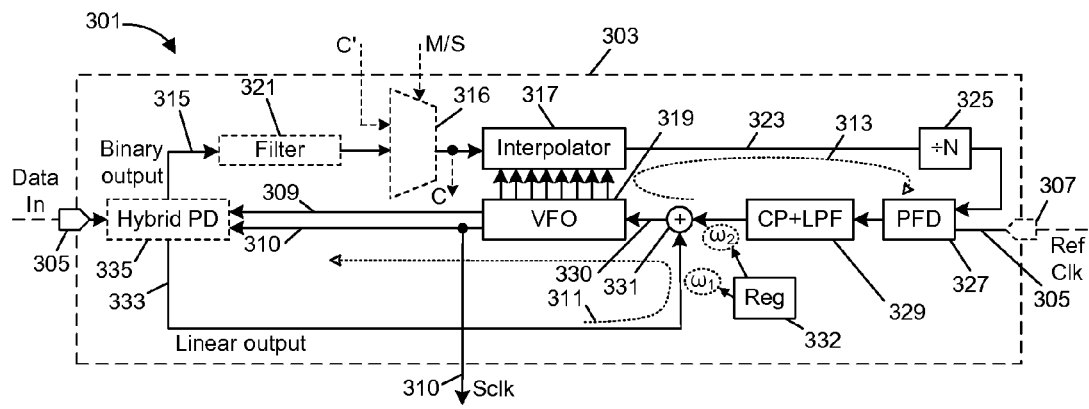
FIG. 3A shows another a clock recovery circuit 301 embodying principles of this disclosure.

FIG. 3A provides a more detailed embodiment of a clock recovery circuit 301 that illustrates principles of this disclosure. Generally speaking, numeral 303 denotes that the depicted circuit is embodied as an integrated circuit sold for use in digital systems. The integrated circuit has a first data pin or pad 305 that, when connected in a signaling system, receives incoming data transmitted from a second, remote integrated circuit (not shown in FIG. 3A). The incoming data signal can be transmitted according to any desired format, including without limitation, as a single-ended, differential, duo-binary, 8b/10b, 64b/66b, 128b/130b, 2-PAM, M-PAM or Manchester-encoded signal, or in another format. In one embodiment, the transmitted signal complies with the PCI express (PCIE), Serial ATA (SATA) or IEEE 802.3 standards. Note that although a single data pin or pad 305 is illustrated, it should be understood that the depicted graphic denotes one or plural conductors. For example, as mentioned, a lane can be a differential signal (where the signal is conveyed using two pins); other signaling schemes can also be used, all collectively represented by numeral 305. The IC also optionally has another signaling pad or pin 307 used to receive a timing reference signal. As pointed out previously, other alternatives include using an on-chip oscillator to generate a PLL reference frequency. This timing reference signal can also be a transmitted as a single-ended or differential signal, or in another signaling format.

The clock recovery circuit of FIG. 3A generates a recovered clock 309 in a manner locked to transitions in the incoming data signal "Data In." In this example, signal 309 is an edge clock that ideally transitions at a time when the voltage of the incoming data signal exactly crosses the voltage midpoint between reciprocal logic states of successive symbols in the incoming data signal. FIG. 3A also shows a second recovered clock 310 that is a sampling clock (Sclk), used to trigger a data sampler to sample the incoming data signal at a data eye midpoint. Although FIG. 3A shows this clock as being drawn directly from the VFO 319 (e.g., from a node in between resonant stages, ninety degrees offset from recovered clock 309), it is also possible to use a separate delay line or phase interpolator to vary sampling phase offset relative to the edge clock. In this event, the sampling phase offset may be dynamically determined, for example, to align a sampling instant with maximum voltage margins while balancing timing margins on both sides of the sampling instant. The sampling phase offset can also be deliberated skewed or adjusted relative to such a point, for example, to an offset that minimizes precursor contribution, or according to some other constraint.

The recovered clock is generated using two different feedback loops 311 and 313. The first loop 311 is a low latency (i.e., fast response) loop that adjusts magnitude of a VFO control signal 330 in dependence on linear phase-error (i.e., in dependence on signal 333). Note that this first loop 311 does not coincide with the feedback portion of the second loop 313. The second loop is manipulated to vary delay in the PLL feedback path responsive to binary phase detection, to align the recovered clock(s) with the incoming data signal (i.e., such that timing of each recovered clock is closely correlated with transitions in the incoming data signal). As introduced earlier, a phase interpolator 317 is controlled responsive to a binary phase-error signal 315, which for example can be in the form of an "up/down" signal. The result of binary phase-error detection is used to control the phase interpolator 317 to step phase upward or downward responsive to whether the recovered clock (e.g., clock 309) is late or early relative to the incoming data signal. The phase interpolator receives multiple, phase separated recovered clock signals from VFO 319, and interpolates between these using discrete digital steps. To provide an example, in one embodiment, the VFO 319 can supply eight recovered clock phases that are equally spaced apart in time; responsive to results of binary phase detection techniques, the phase interpolator can provide output an interpolated clock for use as the feedback timing signal of the PLL path using 64 or more discrete phase steps. Recalling that the feedback path of loop 313 smoothes these phase steps, the dithering of the binary phase-error signal 315 effectively results in a VFO output having an average phase and frequency. For example, if the binary phase-error signal repeatably increases phase selection to "45 degrees" for a given frequency an average of 20% of the time, and decreases phase selection to "40 degrees" at the same frequency for an average of 80% of the time, the VFO clock will closely mimic a phase angle of "41" degrees at this same frequency.

Note that a number of optional circuit elements 316 and 321 are illustrated in FIG. 3A. First, a filter 321 can be employed to gate phase updates to the recovered clock signal to (i) only transitions, (ii) a specific subset of all transitions, and (iii) using a specific filtering process (e.g., to suppress random noise). Several specifically contemplated options will be discussed below in connection with FIG. 4D. Second, a multiplexer 316 can optionally be employed to place the clock recovery circuitry 303 for the specific lane in master mode or slave mode. This will also be further discussed below, in connection with FIG. 7; if a clock recovery circuit is in slave mode (as dictated by control signal M/S), then the binary phase-error signal is drawn from the clock recovery circuitry from an external source or from another lane. If the phase-error signal is drawn from another lane, phase detection including linear phase detection for the slave lane can optionally be turned "off" at certain discrete times. In one contemplated embodiment, one lane always serves as a master (i.e., having clock recovery circuitry such as discussed above) while multiple lanes always operate as slaves—in this case, the phase detector 335 and filter 321 for slave lanes can be omitted and the multiplexer 316 reduces to becoming a direct input for each slave lane.

The phase of recovered clock selected for PLL feedback is fed down signal path 323 to a circuit 325 that divides the clock signal by a predetermined amount (N), for example, by 8. This permits a relatively low frequency timing reference signal to be used (e.g., at $\frac{1}{8}^{th}$ the expected data rate, or $\frac{1}{16}^{th}$ the expected data rate in the case of double data rate signaling). Note that it is expressly contemplated that the parameter "N" should be programmable by external command, for example, from a CPU, transmitter IC, memory controller, or other type of remote signaling circuit; an appropriate value of N can be programmed on a one-time basis, at system power-up, or dynamically, depending on specific application. Also note that (although not separately shown by FIG. 3A), the clock recovery circuit 301 can be designed as a fractional PLL by also providing a multiplier (i.e., to multiply the clock rate by M) at an appropriate position in the clock recovery circuit. Irrespective of clock rate division or multiplication, the timing signal from the feedback path 313 is provided to a phase-frequency detector (PFD) 327, which compares transitions of the (divided) recovered clock with the timing reference signal. Responsive to deviation between these two, the PFD 327 outputs an error signal to circuitry 329. The circuitry 329 is configured to implement a low-pass filter and a charge pump. The low-pass filter smoothes phase error and random noise as has previously been described, and the charge pump circuitry generates a control signal with a variable magnitude—the variable magnitude represent frequency to be generated by the VFO 319. That is, this circuitry 329 effectively accumulates binary updates as they are applied to the VFO and generates a control signal magnitude responsive to aggregate (accumulated) error.

Thus, as the incoming data signal leads or lags the recovered clock, the binary phase-error signal causes the interpolator 317 to phase-shift the timing signal fed back through the loop 313. In turn, this causes circuitry 329 to increase or decrease the magnitude of the control signal and thereby increase or decrease the frequency of the VFO's output (e.g., signals 309/310 and the recovered clock phases provided to the phase interpolator).

A summing junction 331 provides the second point of control for clock recovery circuit. This junction receives both the control signal generated by circuitry 329, as well as linear phase-error signal 333. As noted earlier, the linear phase-error signal is in one embodiment designed using an integration or a sample-and-hold technique, such that its magnitude varies directly with timing difference between the incoming data signal and the recovered clock (e.g., with edge clock signal 309). Subject to appropriate weighting, the linear phase-error signal is directly summed with the VFO control signal to produce a modified control signal 330, to control the VFO 319 (and frequency of the recovered clock). This simple design contributes to the very low latency of response path 311. Note that an optional register 332 can be supplied to store one or more programmable weights (e.g., $\omega_1$ and $\omega_2$) so as to adjust as appropriate the relative contribution of binary and linear phase adjustment. In addition, this register can be used to store other clock recovery circuit parameters, such programmable bit rate, the quantity "N" for the divider circuit, whether slave mode is to be utilized, and other parameters as desired.

FIG. 3A also references use of an optional hybrid phase detector circuit 335. As mentioned, while one embodiment uses separated bang-bang and linear phase detectors, a hybrid circuit can also be used which generates both binary and linear phase-error signals, helping to minimize power consumption and footprint. Examples of such a hybrid phase detector circuit are given in FIGS. 4A and 4D.

Conventional clock recovery circuits based only a binary phase-error signal are often associated with substantial dither jitter. The structure depicted in FIG. 3A minimizes this jitter both by use of the linear phase-error signal as well as by injection of binary phase-error into a feedback path of the PLL. Note that a typical VFO (e.g., a VCO) configured as a ring oscillator inherently produce clocks at regular phase offsets (e.g., 90, 180, 270 degrees). Each of these clocks is tapped to provide a different feed to the phase interpolator 317, and predetermined ones of these clocks are also applied as the primary recovered clock (or edge sampling clock) 309 and as the data sampling clock 310. When the binary output of optional filter 321 indicates an offset relative the incoming data signal, the interpolator 317 changes the phase of the feedback path 313 by a single step. Because of the divide by N circuit 325, the PFD 327 consequently detects a deviation in phase at most every N system clock cycles, and low-pass filtering leads to a relatively smooth rate of change in the VFO control signal 330. The net effect is that the VFO output migrates smoothly to the center frequency and phase of the incoming data signal. The mathematics associated with this adjustment will be further discussed below in connection with FIG. 9.

Figure 3B:
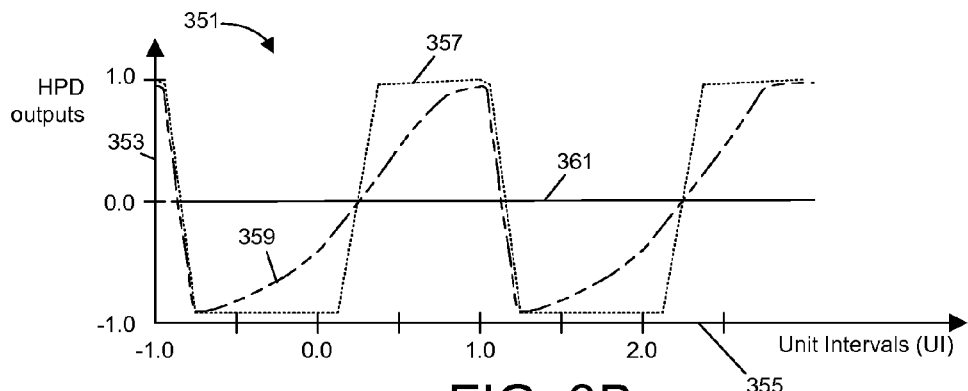
FIG. 3B is a graph 351 showing binary and linear phase-error signals, each as a function of unit interval.

Returning again to the discussion of binary versus linear phase detection and the use of relative weights $\omega_1$ and $\omega_2$, FIG. 3B provides a graph 351 that illustrates the relationship between the binary and linear phase-error signals at steady state. Note that FIG. 3B is not intended to represent the simultaneous use of both of these phase-error signals, i.e., generally speaking, one of the binary or linear signals will dominate, thus effecting the response of the other. Nevertheless, FIG. 3B helps illustrate interplay between these two phase-error signals 315 and 333. The binary phase-error signal 315 output will dither at steady state as it tries to lock to a frequency represented by horizontal line 361. When the binary phase-error signal causes the phase/frequency of the recovered clock to shift downward, after a slight delay, the linear phase-error signal indicates a negative error, indicating that the recovered clock lags timing of the incoming data signal. The linear phase-error signal is used to adjust magnitude of the VFO control signal using a fast response loop and, consequently, the recovered clock quickly shifts to match timing of the incoming data signal. Conversely, if the binary phase-error signal transitions positively (increasing VFO frequency to a point where the recovered clock leads timing of the incoming data signal), the linear phase-error signal indicates a positive error, and is used to reduce magnitude of the VFO control signal, by direct summation with the signal output by circuitry 329. Note that adjustment of relative weights $\omega_1$ and $\omega_2$ has the effect of adjusting the slope of the linear phase-error signal. With use of an appropriate filter 321 (see the discussion of FIG. 4D below) and by properly setting the weights $\omega_1$ and $\omega_2$, VFO adjustment responsive to the linear phase-error signal is set so as to be balanced by binary phase adjustment, i.e., so as to reduce or eliminate dithering at steady state responsive to the binary phase-error signal. A training sequence and/or calibration process can be used to measure response of the clock recovery circuit while sweeping $\omega_1$ and $\omega_2$ through possible settings, for example, using a bit error rate (BER) measurement technique and selecting settings for $\omega_1$ and $\omega_2$ which yield the lowest BER (and lowest overall jitter). Note also that the effect of bit rate changes in the incoming data signal will be to change the slope of the linear phase-error signal relative to the dithering rate of the binary phase-error signal, increasing slope for high frequency changes, and decreasing the slope for low frequency changes. Thus, the weighting of each of the phase-error signals is advantageously recalibrated any time the bit rate of the incoming signal changes. Note that many newer digital systems support dynamically programmable bit rates; that is, when a new bit rate is programmatically assigned to a receiver IC or is otherwise recognized by the receiver IC, the weights $\omega_1$ and $\omega_2$ can be automatically recalibrated. Previously calibrated settings may also be stored and re-used, e.g., for fast adjustment to track transitions between frequencies.

Figure 3C:
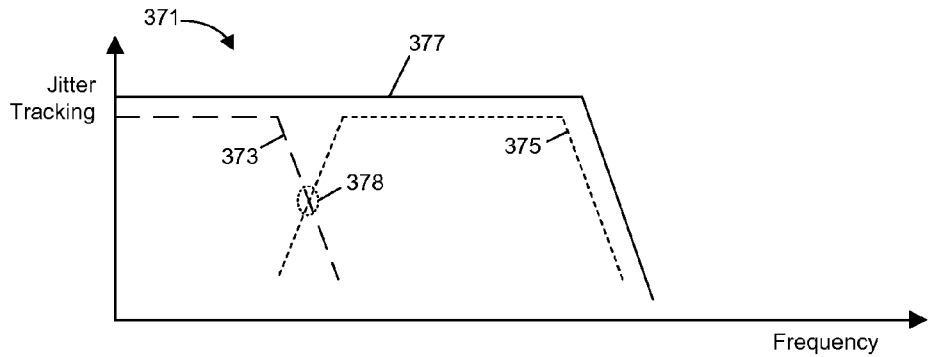
FIG. 3C is a graph 371 of jitter tracking versus frequency, for each of binary and linear phase-error signals in the clock recovery circuit of FIG. 3A.

FIG. 3C is a graph 371 of effective jitter tracking versus frequency for the clock recovery circuit 301 of FIG. 3A. More specifically, the binary path response (corresponding to signal 315 from FIG. 3A) sets the lock point of the clock recovery circuit 301, but has relatively long latency and thus limited bandwidth, as represented in aggregate by curve 373 in FIG. 3A. At relatively low frequencies, the slope of the linear response path is shallow, for example, at a lesser incline than the curve 359 from FIG. 3B; the dithering of the binary phase-error signal thus dominates response of the clock recovery circuit, as represented by the dominance of curve 373 at low frequency in FIG. 3C. As frequency increases, the slope of the linear path response (i.e., curve 359 in FIG. 3B) increases and contributes more heavily to overall clock circuit response. At a point, represented by point 378 of FIG. 3B, both of the binary and linear response paths are well balanced in their influence of the clock recovery circuit; this relationship also roughly corresponds to the relative curves/waveforms 357 and 359 seen in FIG. 3B, discussed above. Finally, as frequency continues to increase beyond the bandwidth of the binary response path, the slope of the linear response path becomes much steeper, dominating overall response of the clock recovery circuit. For example, assuming that divider circuit 325 from FIG. 3A is programmed to divide by ten and that the feedback path 313 takes ten operating clock cycles to convey changes to change the recovered clock output by the VFO, this means that 100 operating clock cycles might be needed to effectuate a phase change using this path. For an operating clock frequency of 4 gigahertz, this would mean that the loop bandwidth of the PLL would track input signal jitter up to 40 megahertz, reflected by the falling edge of curve 373 from FIG. 3C. Note that the linear response path however does not follow the feedback path 313 and does not require processing by the divider circuit 325, PFD 327 or charge pump/low pass filter 329 from FIG. 3A in order to adjust the VFO. Rather, as mentioned, the linear phase-error signal is advantageously preconfigured to have a linearly varying magnitude (e.g., voltage) and thus is readily applied to modulate the VFO control signal. Thus, as reflected by the differences between curve 375 and curve 373 at the right side of graph 371, at high frequencies, the linear response path dominates. As a consequence, the clock recovery circuit continues to operate well beyond the bandwidth of the binary response path (i.e., well above 40 megahertz in this example; this is again attributable to the low latency of the linear response path (see curve 311 from FIG. 3A). Because of the combined use of both the binary and linear response paths, the aggregate response of the clock recovery circuit extends to much higher signaling rates, as depicted by the overall response curve 377. Note that the relatively flat depiction of this curve 377 and the crossing point 378 are rough and approximate; the point is that the effects of the combined binary and linear response paths are a higher frequency response and greater effective bandwidth as compared to a conventional clock recovery circuit. Note once again that, assuming a given signaling rate, the programmable factors $\omega_1$ and $\omega_2$ can be statically or dynamically adjusted so as to optimize clock recovery circuit response for that signaling rate.

Figure 4A:
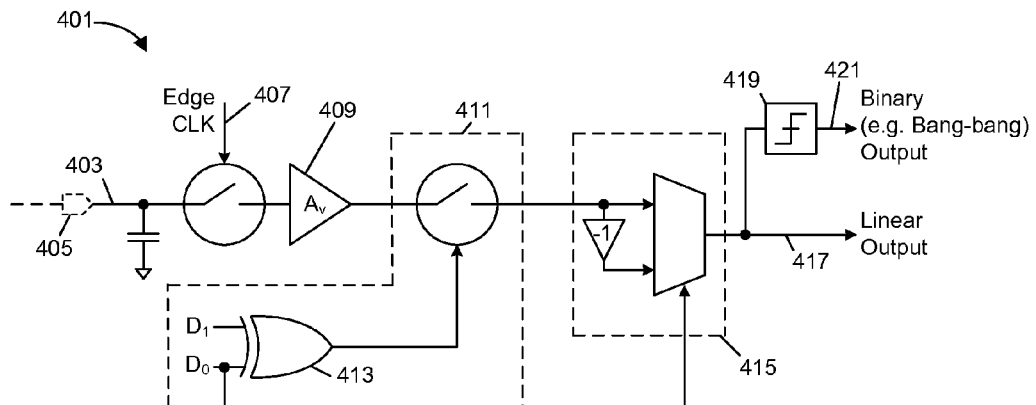
FIG. 4A shows a hybrid phase detector 401 that can be used as element 335 of FIG. 3A; the hybrid phase detector 401 uses a common set of components to generate both a linear phase-error signal 417 and a binary phase-error signal 421.

FIG. 4A shows a first hybrid phase detector 401 that can be used as element 335 of FIG. 3A. Specifically, an incoming data signal is received on signal path 403. In an embodiment where the hybrid phase detector 401 is used for signaling between different integrated circuits, the incoming data signal 403 arrives at an optional IC signaling pad or pin 405 from an external conductor (e.g., from a PC board signal trace, a flexible cable, a package connection, or some other means). As before, although only a single path and pin or pad is shown, the depicted graphics contemplates differential or other forms of signaling. At an appropriate sampling time triggered by a transition of an edge clock (Edge Clk 407), the hybrid phase detector 401 samples voltage present on signal path 403. Note that in many embodiments, the edge clock (Edge Clk 407) is the recovered clock referred to earlier, but it can also be phase- or frequency-offset from the recovered clock. The clock and an amplifier 409 serve to sample voltage at every edge clock transition, regardless of whether the sample represents a transition in logic state of the input signal, and to provide a buffered sample to a filter 411. The filter 411 can be configured in a many different manners depending on embodiment and application. For the embodiment of FIG. 4A, the filter 411 restricts passage of edge samples to only those samples that represent a logic state transition between adjacent symbols of the incoming data signal. For example, if binary signaling is used, with a voltage swing of 0-1.2 volts, the midpoint between symbol logic states should lie at approximately 0.6 volts. In the embodiment of FIG. 4A, the filter is predicated on an exclusive-OR (XOR) circuit 413 that outputs a high signal only if a current data sample ($D_0$) and immediately previous data sample ($D_1$) have opposite binary values, e.g. there was a transition from one value to another. The edge sample from filter 411 is then passed to a circuit 415 that normalizes sign of the edge sample depending on whether the recovered clock is early or late. In this regard, note that if the edge sample for a logic 0-1 transition in the input signal is greater than voltage swing midpoint (e.g., 0.6 volts), the recovered clock is late (i.e., the recovered clock should be sped up). Conversely, if the logic state transition represents a 1-0 logic transition, the opposite is true, i.e., an edge sample greater than voltage swing midpoint indicates the recovered clock is early and should be slowed down. For this reason, the circuit 415 includes a −1 gain stage, which effectively inverts any error represented by the edge sample depending on the logic state of the current data symbol ($D_0$). The circuit 415 can also include circuitry that normalizes the edge sample, for example, adding a scaling factor ($\omega_1$), or subtracting a decision threshold, e.g., to normalize alignment of the incoming data signal to the recovered clock to a zero level. Whether or not normalization is applied, the output of the circuit 415 is a linear phase-error signal 417 that varies in magnitude dependent on the relative timing of the edge transition. That is, in practice, the edge crossing of the incoming data signal is not completely vertical, but has a slope. If the edge sample taken during this slope indicates edge-crossing voltage is much higher than it should be at the recovered clock edge time, the linear-phase-error signal 417 is accordingly larger or smaller (depending on the direction of logic level transition). Note that the particular hybrid phase detector 401 of FIG. 4A could be predicated on a sample-and-hold circuit, an integration circuit, or a circuit that performs both functions. With a sample-and-hold design, a voltage sample of the incoming data signal is taken relative to the expected edge-crossing voltage midpoint and is then retained and used to generate a linear phase-error signal. With an integration design, a voltage (or current) is initialized, and a reference point (e.g., a voltage transition midpoint) of one of the incoming data signal or the recovered clock is used to start and accumulate results of integration. The linear-phase-error signal is applied to a simple sampler 419 to generate the binary phase-error signal 421. For example, again using the example of an expected voltage swing of 0-1.2 volts, the sampler 419 can use a decision threshold of 0.6 volts to output a first binary state if the edge sample exceeds this amount and a second binary state if the edge sample does not exceed this amount. Note that many additional techniques can be used in addition to or in lieu of specific circuits illustrated in FIG. 4A, for example, to implement data level tracking (and corresponding adjustment of the threshold of sampler 419 or of other circuits). In other words, it is possible to measure dynamically voltage swing and the voltage level that carries each logic state (subject to system attenuation) in situ, and so to scale thresholds to adapt to the exact signal swing midpoint (or another edge crossing point, as desired).

As mentioned, the filter 411 can take different forms depending on implementation. For example, as is well known, many wired channels are characterized by skin effect or dielectric loss, which attenuates and disperses high frequency data. As a consequence, voltage exhibited by the incoming data signal for any given logic state can vary depending on the immediately preceding symbols due to inter-symbol-interference (ISI). The effect of this variation is to skew the signal voltage at the true edge crossing time of the incoming data signal. Assuming for example the use of binary signaling and the presence of such dispersion, voltage representing the binary "0" in the 3-bit sequence 1-1-0 would be greater than for the second binary "0" in the 3-bit sequence 0-1-0; thus, the voltages at the exact midpoint of the "1-0" transition in each of these sequences will also different. If an edge sample is taken for all such transitions, the edge sample may not be a consistent indicator of recovered clock timing error. That is, a transition voltage associated with the first 3-bit pattern might falsely indicate the recovered clock is early, while a transition voltage associated with the "1-0" transition of the second bit pattern might falsely indicate the recovered clock is late. It is therefore advantageous in some embodiments to further restrict filtering applied by filter 411, not just to all logic level transitions, but rather, to one or more specific subsets of all possible logic level transitions. For example, in the hypothetical just described, the three-bit patterns 0-0-1, 1-0-1, 0-1-0 and 1-1-0 all feature transitions in between the second and the third bits; however, by restricting clock recovery updates "just" to the symmetrical bit patterns 0-1-0 and 1-0-1, one obtains a more consistent set of edge sample timing which is more tightly correlated with true transmit timing. Other types of filters are of course also possible.

Figure 4B:
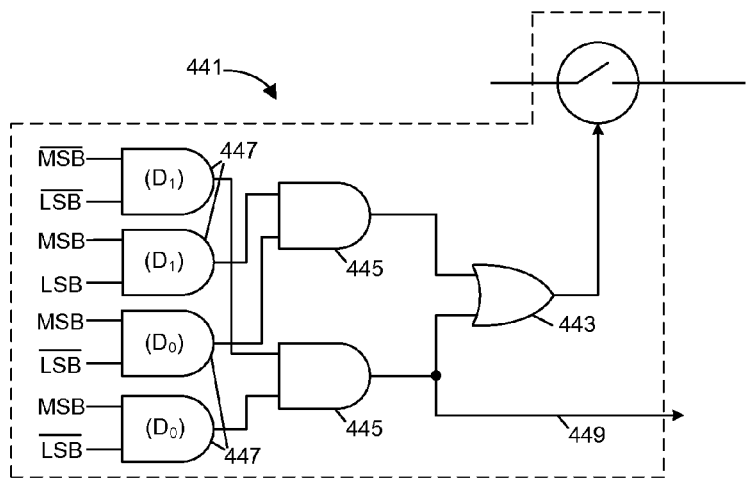
FIG. 4B shows a data filter 441 for a multi-PAM signal (e.g., a 4-PAM signal), usable in lieu of element 411 from FIG. 4A.
Figure 4C:
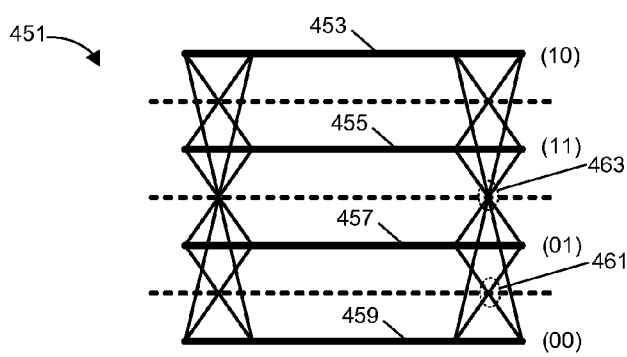
FIG. 4C is used to illustrate signal levels associated with 4-PAM signaling.

FIG. 4B shows a filter 441 for a multi-PAM signal (e.g., a 4-PAM signal), usable as element 411 form FIG. 4A. As is known, a 4-PAM symbol typically has four signal levels, each of which represents a corresponding one of the patterns 00, 01, 11, and 10 in a two-bit sequence. This relationship is illustrated in FIG. 4C, which sets forth an eye diagram 451 identifying transitions between each of four signal levels 453, 455, 457 and 459. As an analogy to the example just discussed, consecutive 2-bit symbols of 00-01 and of 00-10 each represent transitions, but with different edge crossings owing to the different voltages associated with their respective states. That is, as depicted in FIG. 4C, a 00-to-01 transition presents a crossing at point 461, whereas a 00-10 transition presents a crossing at point 463. In such a situation, a designer might wish to restrict clock recovery updates to full swing transitions (e.g. 00-to-10 and 10-to-00), or to another subset of transitions centered on a specific voltage at a specific time. Any set of transitions can be used, as long as the timing point and reference voltage are correlated and bear a predetermined relationship to a recovered clock edge—for example, point 461 can also be used in an embodiment that restricts updates to 00-to-01 and 10-to-00 transitions. FIG. 4B shows a filter that restricts updates to full-swing transitions; that is, two separate sets (445 and 447) of AND gates and an OR gate 443 restrict updates just to 00-to-10 and 10-to-00 transitions. As should be apparent from signal feed 449, the direction of swing once again is again used to selectively invert the effect of any error represented by the edge sample (e.g., via circuit 415 from FIG. 4A).

Figure 4D:
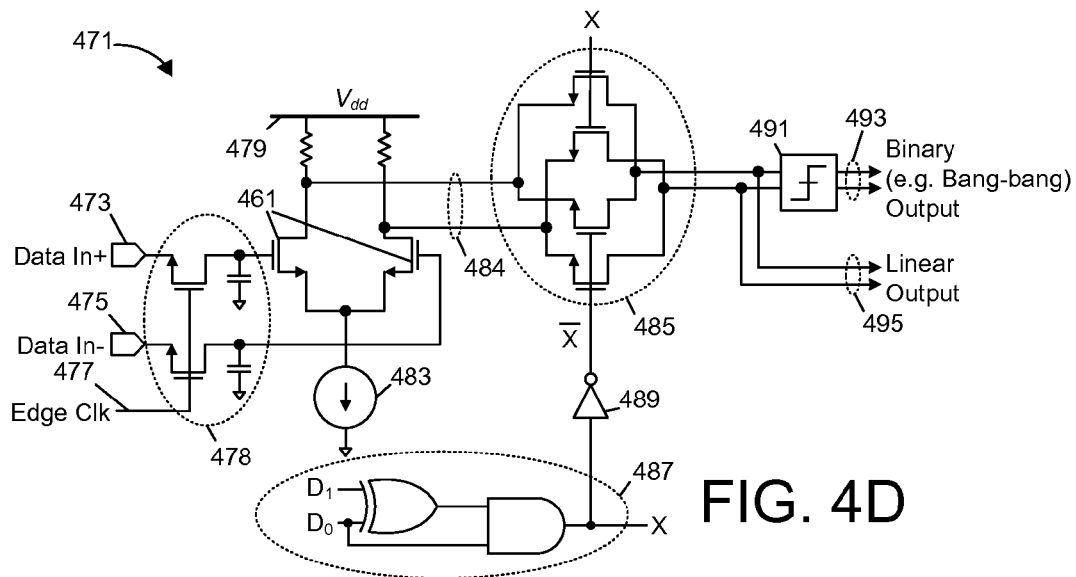
FIG. 4D shows another hybrid phase detector 471, also usable as element 335 of FIG. 3A; this hybrid phase detector 471 is suitable for use when the incoming data signal is a differential signal (represented by differential components or legs "Data In+" and "Data In−" in FIG. 4D).

FIG. 4D provides a hybrid phase detector suitable for use with a differential input signal. More particularly, the incoming data signal is seen as represented by differential components or legs "Data In+" and "Data In–." Such a signal might be used for example in a PCIE, SATA, IEEE 802.3 or other transmission scheme. In an embodiment where clock recovery is used for reception of signals transmitted between integrated circuits, data is received at pins or pads 473 and 475. An edge clock derived from the recovered clock is also received as signal 477, and used to sample the incoming data signal, effectively integrating incoming voltage relative to the transition time of signal "edge clock." The depicted capacitors presents a relatively large RC time constant relative to the period of the signal "edge clock," such that the depicted circuit 478 both functions as an integrator and functions as a sample-and-hold circuit. Note that instead of using signal "edge clock" to enable a pair of transistors, the signal edge clock could be applied to a sampler (e.g. to trigger a more traditional sample-and-hold circuit). These various signals are used to drive standard CMOS components and a relatively conventional push-pull differential receiver, for example, as represented by a power supply 479 ($V_{dd}$), differential-pair transistors 481, and a current source 483. While this structure is analog in nature, it provides fairly good power supply noise rejection. The sampled differential signal, represented by numeral 484, is once again applied to a circuit 485. This circuit includes reciprocal transistor pairs that effectively sample-and-hold an edge sample and invert the differential signal depending on the output of filter 487; as was the case for the embodiment of FIG. 4A, this filter effectively applies an XOR function to successive binary symbols ($D_0$ and $D_1$) to restrict edge updates to symbol transitions. A differential edge sample passed by this structure is then passed as an output to the linear phase path, represented by numeral 495, and to sampler 491 for the binary phase path 493. Note that this linear phase path output only goes through a sampling switch, not a logic gate, thereby preserving phase information (i.e., a voltage output that varies linearly depending on phase difference). If desired, the differential signals contemplated by FIG. 4D can at any point be converted to a single-ended or other format, as desired. Also, as before, the design of the filter 487 can be varied depending on embodiment, for example, to restrict edge samples (and recovered clock error signal generation) to a subset of state transitions between adjacent incoming data symbols.

Figure 4E:
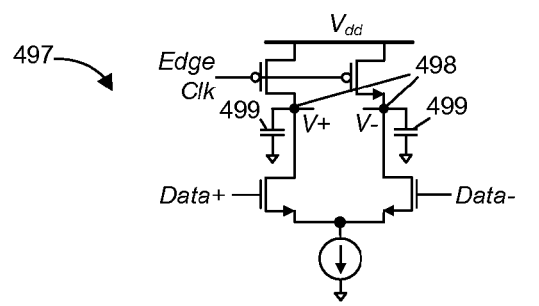
FIG. 4E shows one embodiment of an integrator that can be used in lieu of circuit 478 from FIG. 4D.

Circuit 497 in FIG. 4E provides another example of a circuit that can be used in place of circuit 478 from FIG. 4D. More specifically, signals "Data In+," "Data In–" and "Edge Clk" are received, as before with FIG. 4D. However, instead of using the signal "Edge Clk" to enable integration/sampling of the incoming data signal "Data In+"/"Data In–," as was the case for FIG. 4D, FIG. 4E uses an inverted copy "Edge Clk" to precharge sampling nodes 498. When "Edge Clk" then transitions high, a precharge source is isolated, allowing signal "Data In+"/"Data In–" to charge/discharge capacitors 499, and consequently voltage nodes V+/V–. Once again, the depicted capacitors 499 present a large RC time constant relative to the duration the period of "Edge Clk."

Figure 5:
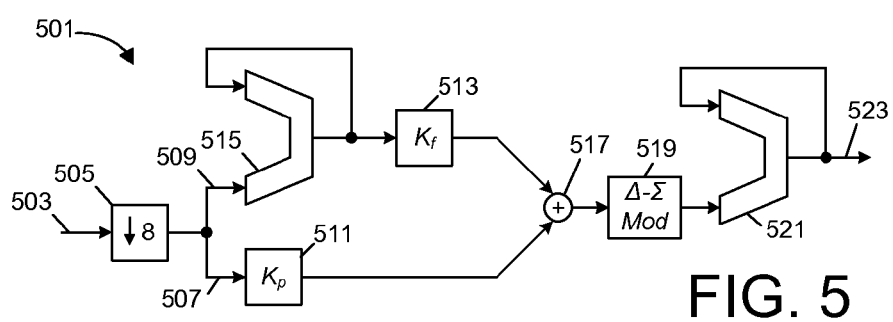
FIG. 5 shows a circuit 501 that can be used as the data filter 321 of FIG. 3A. This circuit receives a series of binary "up/down" signals based on comparison of the incoming data signal with the recovered clock, and it applies a second order filter that accumulates phase error using one of two accumulation rates depending on whether phase tracking is "keeping up" with transitions in the incoming data signal.

FIG. 5 shows a circuit 501 that can be used as the filter 321 of FIG. 3A, that is, a filter that accumulates binary phase-error and otherwise filters for random noise as appropriate.

The binary phase-error signal 503 is received and decimated by eight (function block 505), and is then provided to a second order filter. The second order filter has two feedforward paths, represented by numerals 507 and 509, which respectively pass the decimated binary phase-error signal and the integral of that signal. The response of each path is scaled by the coefficients $K_p$ and $K_f$ in blocks 511 and 513, respectively. That is, first-order phase error is assigned a first weight ($K_p$), while accumulated error which overflows or underflows an accumulator 515 is assigned a second weight ($K_f$). As should be appreciated, the accumulator 515 counts upward or downward in response to the phase-error signal 503 and only overflows or underflows if aggregate phase error correction provided via path 507 fails to "keep up" with phase in the incoming data signal. This overflow or underflow is perceived as a frequency deviation, and, consequently, the second weight ($K_f$) essentially assigns a larger weight in this event (i.e., error is counted "faster"). The outputs of each the first and second paths (and their respective weightings) are effectively combined by a summing junction 517, when then feed a delta-sigma modulator 519. The delta-modulator provides a binary up/down output with the time-averaged value representing phase deviation of the incoming data signal relative to the recovered clock. An accumulator 521 also counts upward and downward for each output of the delta-sigma modulator, and so effectively tracks the time-average value just referenced, underflowing or overflowing as appropriate. These underflows and overflows generate a binary "up/down" phase-error signal 523, indicating that PLL feedback signal phase (e.g., via the phase interpolator) should be shifted earlier or later. Thus, the net effect of circuit 501 is that binary error is filtered and accumulated, with and up/down signal being output in response to second order phase processing. While the depicted filter provides one specific example of a filtering circuit, clearly, other circuits can be used depending on implementation, including first order filtering, third order, or other filtering; third order filtering is particularly relevant to spread-spectrum clocking (SSC) applications, or elsewhere where sharp, regular frequency changes are anticipated in view of the signaling scheme. Other alternatives are also possible.

Figure 6:
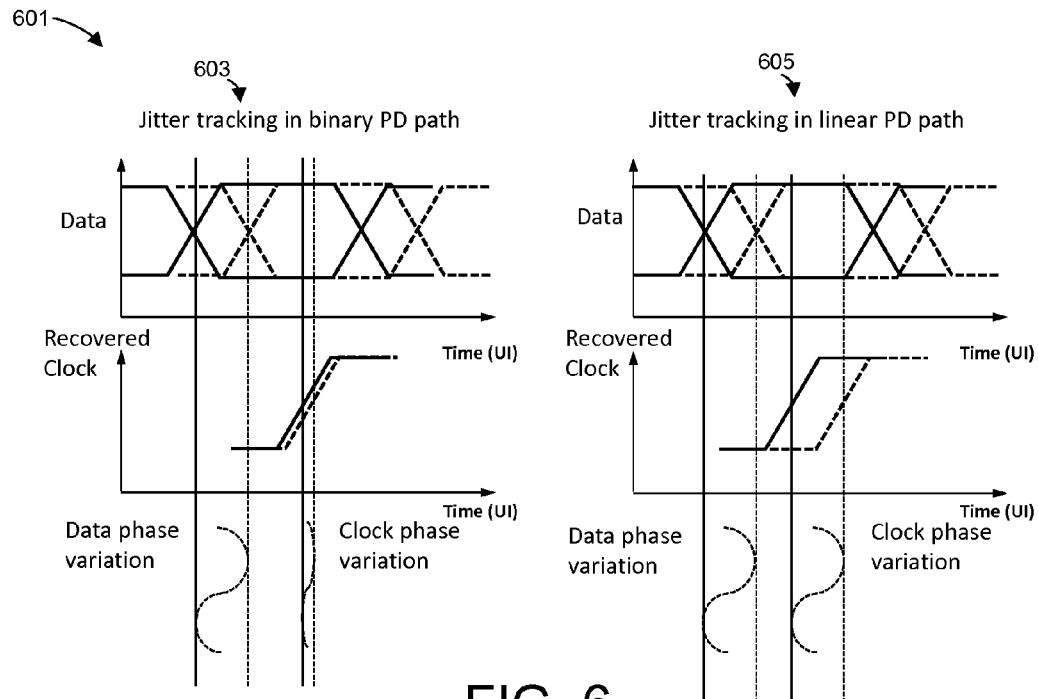
FIG. 6 is frequency response diagram 601 illustrating interplay of binary and linear phase detection techniques. The diagram is divided into a left halve 603 and a lower halve 605.

FIG. 6 provides a response diagram 601 illustrating the practical effects of two-point PLL modulation in a clock recovery circuit. FIG. 6 is conceptually divided into two halves, including a left halve and a right halve 603 and 605. These halves show how timing variation (also known as jitter) is tracked by the two response paths of the clock recovery circuit. Each halve 603 and 605 shows at its top the same data eye diagram colored by jitter (which is represented as the data eye variation between solid and dashed line signals). The digital path that involves bang-bang phase detector and digital loop filter, represented by the left halve 603 of FIG. 6, experiences relatively greater latency. As a result, the loop bandwidth in this path is low, and data phase variation remains largely untracked as shown by the left-halve 603 of the Figure. This lack of tracking results in timing margin penalty also known as jitter tolerance degradation. By contrast, the digital response path involving predicated on a linear phase-error signal, seen on the right halve 605 of FIG. 6, has a much lower latency, so loop bandwidth of this path is much wider. As a result, input data phase variation is tracked up to very high frequency. Note that on right halve, a solid line eye is (seen at the top of the Figure) sampled by the solid line data clock (seen in the middle of the Figure) while a broken line eye is sampled by broken line data clock. In both cases, the edge of the data clock is seen at the center of the eye—without loss of timing margin. Therefore, jitter tolerance is maximized in this case.

Figure 7:
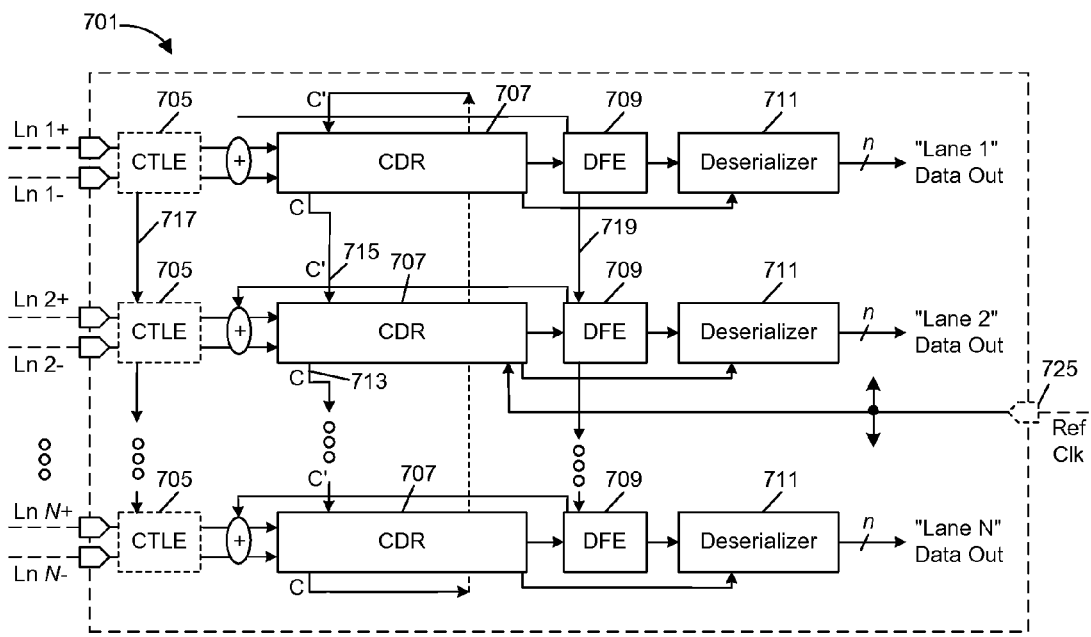
FIG. 7 is an illustrative diagram 701 of an integrated circuit having plural differential lanes, each with optional equalization circuitry (705/709), a respective clock and data recovery (CDR) circuit 707, and a respective, optional deserializer 711.

FIG. 7 contains an illustrative diagram 701 of an integrated circuit with receivers for plural differential lanes, each with each receiver having optional equalization circuitry (705/709), a respective clock and data recovery (CDR) circuit 707, and a respective, and an optional deserializer 711. The CDR circuit for each lane can be predicated on the clock recovery techniques discussed above, with or without use of a hybrid phase detector circuit. Note that each incoming data signal (i.e., the signal for each lane) is depicted as a differential signal, that is, comprising positive and negative differential component paths, such as indicates by component signals Lane 1+/−(Ln1+ and Ln1−), and so forth.

Generally speaking, at higher signaling rates, it becomes increasingly difficult to interpret signals without some form of receiver-based equalization. It is noted that many standards for high-speed signaling formats either call for or permit some form of receiver-based equalization. In this regard, a continuous time linear equalizer (CTLE) 705 provides a low power means to equalize attenuation attributable to channel loss. Additionally, an appropriately configured CTLE can ease circuit requirements for a decision feedback equalizer (DFE) 709. That is, with the CTLE being overdriven to mitigate frequencies associated with a first post-cursor, the DFE can then be operated with reduced feedback timing constraints, such that it addresses reflections from with higher-order postcursors only (as well as effect from the overdriven CTLE that worsens other postcursors). Despite these benefits, a CTLE also potentially distorts edge samples used for clock recovery, and thus may not be desired for all systems. The CTLE is therefore depicted in dashed lines in FIG. 7, to indicate optional usage.

Each lane's DFE 709 relies on the digital values of previously received and interpreted digital symbols from the respective incoming data signal; these values are typically used to negate dispersion, or in some cases reflections in the signaling line originating at impedance discontinuities, and so these digital values are weighted, summed, and used to generate an analog voltage that is subtracted from the incoming data signal. In the embodiment depicted in FIG. 7, it is assumed that some form of DFE is used for each lane (i.e., to address at least one post-cursor), although here also, the DFE can be optional depending on embodiment.

A receiver for each lane is also seen to include a deserializer, to convert n consecutively received data symbols into n parallel bits (as represented by the slash across each lane's respective output signal). A recovered clock from the CDR is used to generate a lower-frequency framing signal to unload the respective deserializer at the appropriate time, and otherwise for timing the processing of consequent parallel words of data. Optionally, a global clock of the receiver integrated circuit can be driven responsive to the recovered clock of one of the lanes, or based on processing (e.g., filtering or other averaging) of the recovered clock from all of the lanes. Such a global clock can also be used for transmit timing for data transmitted to another integrated circuit, for example, in an opposite direction over the signaling lanes 1-N, or to a third integrated circuit.

It was earlier mentioned that a clock recovery circuit for some embodiments could be selectively programmed for operation in a slave mode. That is, it was mentioned in connection with FIG. 3A that a multiplexer 316 could be optionally used to selectively pass either (a) binary phase-error signal from that clock recovery circuit's binary response path or (b) a phase update signal from an external source, in lieu of the phase-error signal from that clock recovery circuit's binary response path. The external source can be a source external to the integrated circuit (for example, with the phase update signal received via a test pin or pad of the integrated circuit), or can be generated onboard the integrated circuit that mounts the clock recovery circuit.

Leveraging this structure, FIG. 7 provides an IC where the clock recovery circuitry of one lane can be put into master mode, and where the clock recovery circuitry of other lanes can be put into slave mode. In embodiments where all lanes originate from a common source, e.g., a transmitting integrated circuit (not shown) where transmit timing for all lanes is derived from a common timing reference, it is expected that the recovered clock for each lane will have the same frequency, but respective phase offset. In such an implementation, all lanes are initially operated in master mode to select a phase specific to each lane (e.g., as represented by a current selection of interpolator phase and a lane-specific VFO control signal magnitude). Once each clock is locked, e.g., as may be detected from the presence of dithering in the respective binary phase-error signal, assumed following passage of a fixed period of time or detected through other means, the phase detector circuitry for each slave lane is turned "off." That is, the associated clock recovery circuitry is placed into slave mode by writing a value to an appropriate register, depowering phase detector circuitry as appropriate, and configuring the M/S control signal for each lane. With reference to FIG. 7, the phase updates from one "master" lane (for example using signal 523 from FIG. 5) are passed as the "C" output of the clock recovery circuit for that lane and received as the "C-prime" input of the ensuing lane. By putting all lanes other than one (e.g., "Lane 1") into slave mode, each lane will take phase updates from the previous lane (or from a predetermined master lane, e.g., a single master lane) in this manner. While the phase detector circuitry for slave lanes is depowered, the phase detector for the master lane in master mode (and associated phase-error updates) continues to operate and shares its phase updates to adjacent slave lanes. During this operation, the linear phase path for the master lane can optionally also be turned off. The lanes in slave mode continue to apply equalization and receive and interpret data, but in such a mode, but based on the assumption that timing jitter is correlated between lanes based on the use of a common timing reference in the transmitter, only the master lane is needed on a marginal basis to track timing jitter. As mentioned, in such an implementation, it can be advantageous to re-enter master mode for each lane on a periodic basis in order to update any change in timing skew between lanes. Note that in alternative embodiments, the linear phase-error signal can also be shared with slave lanes; also in alternative embodiments, one of the other of linear and binary phase detection can left on, independently operating for each slave lane. In still further alternate embodiments, initial phase offsets can be established by other means, and/or the multimodal reconfiguration (e.g., i.e., the muxing) of slave lanes can be eliminated altogether.

Other signals can be shared between lanes as well. For example, if signaling paths are trace-matched, it is be possible to share other settings between lanes, such as linear equalization settings, equalization tap latency selection and specific tap weights, as represented by signals 717 and 719.

Figure 8:
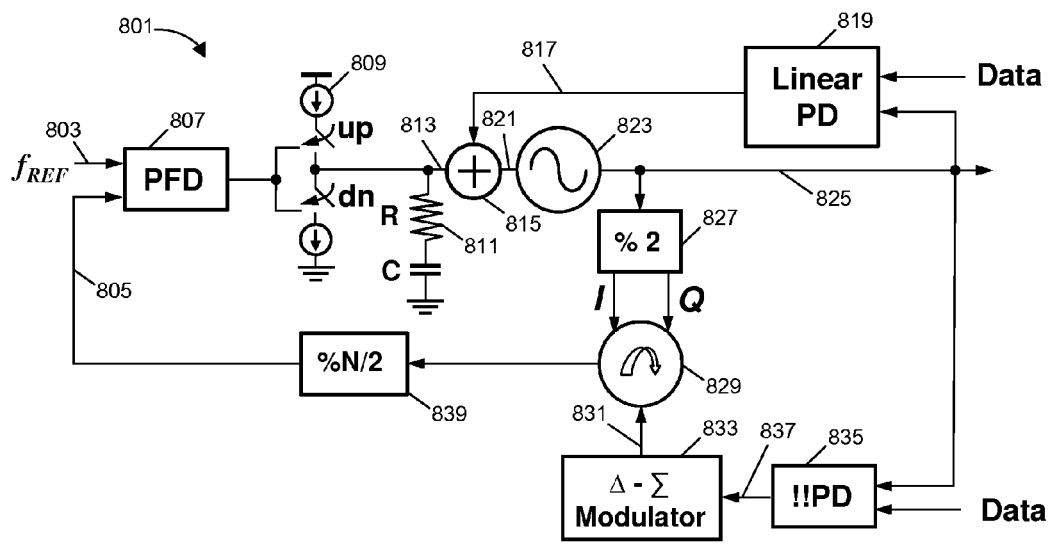
FIG. 8 shows another a clock recovery circuit 801.

FIG. 8 shows another embodiment of a clock recovery circuit 801. A timing reference signal 803 is compared with a PLL feedback signal 805 by a phase frequency detector (PFD) 807. The PFD generates a variable-width pulse corresponding to time between a edge of the timing reference signal and a corresponding edge of the PLL feedback signal 805. The variable-width pulse is applied to a charge pump 809 and low pass filter 811, to generate a VFO control signal 813. A summing junction 815 modifies the VFO control signal in dependence on an output 817 from a linear phase detector 819. As before, the output 817 is a linear phase-error signal having a magnitude (e.g., voltage or current) that varies directly with difference in phase between the recovered clock 825 and the incoming data signal "Data." Because this signal is of a similar format to the VFO control signal 813, it can be easily applied to modulate the VFO control signal, for example simply by summing the two signals together (with any appropriate scaling or weighting). The linear phase detection path therefore provides a fast response loop and with control responsive to error detection (injected into a feedforward path of the PLL). The result is a modified VFO control signal 821, which is applied to control the VFO 823 to generate the recovered clock 825.

The VFO output is also divided by two via circuit 827 to generate a set of quadrature recovered clocks, I and Q. As before, more than two phases of recovered clock can be generated, e.g., eight or more in some embodiments. These clocks are provided to a phase interpolator 829. The phase interpolator is controlled responsive to a binary phase-error signal 831. As before, the binary-phase error signal 831 is output from a delta sigma modulator, which in turn accumulates up/down signals 833 from the bang-bang phase detector 835 (!!PD). Note that the up/down signals are also binary-phase error signals. An interpolated recovered clock produced by the phase interpolator is then provided to a divide-by-½N circuit 837 (% N/w) to generate the PLL feedback clock 805. The results of binary phase detection are injected at a second control point of the PLL, that is, into the PLL's feedback path. As before, this has the effect of smoothing any phase/frequency adjustment responsive to binary phase detection, in a manner where the recovered clock smoothly migrates to the center frequency of the incoming data signal "Data." That is, compared to a conventional phase detector using bang-bang phase techniques only, the jitter of the recovered clock is reduced, because the edges of the recovered clock are not limited to frequency multiples of the timing reference signal.

Figure 9:
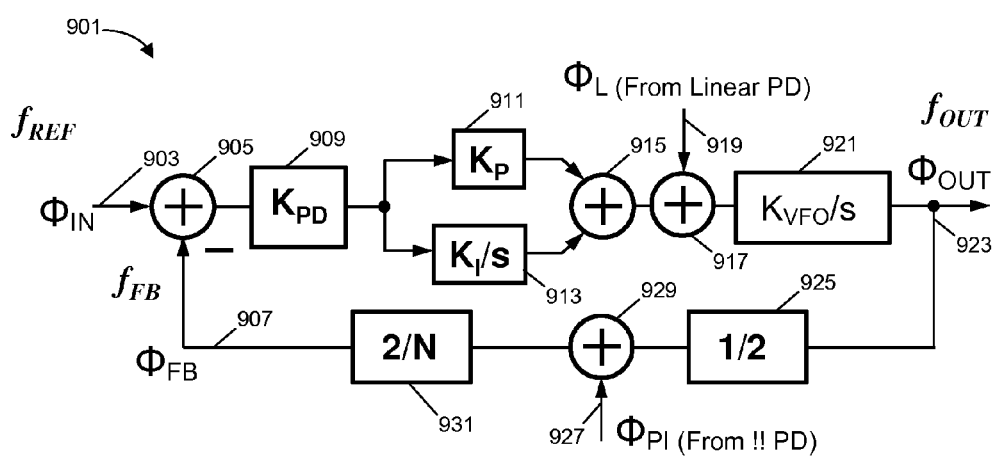
FIG. 9 shows another clock recovery circuit 901; more particularly.

FIG. 9 shows a circuit equivalent of the design seen in FIG. 9, and is used to understand the behavior of the circuit of FIG. 8. FIG. 9 shows another embodiment of a clock recovery circuit 901. Timing represented by the incoming data signal 903 is input to a comparator 905, which produces a signal representing the difference in edge timing between the incoming data signal 903 and a recovered clock 907. This difference signal is subject to phase detector gain $K_{PD}$ and second order phase processing gain (i.e., proportional gain $K_P$ and integral gain $K_i/s$), per reference numerals 909, 911 and 913. Results of second order processing are summed at summing junction 915 and then provided to a first PLL control point 917. This control point, once again, injects the results of linear phase detection 919 to modulate a VFO control signal. Gain from the VFO is represented by box 921 and gain factor $K_{VFO}/s$ and results in generation of the recovered clock 923. As before, this recovered clock is then fed back within the PLL to a divide-by-two circuit (e.g., to generate quadrature clocks), to the second phase-error injection point (i.e., responsive to binary phase-error detection), and to a divide-by-N circuit, represented by numerals 925, 927, 929 and 931, respectively.

As discussed previously, the use of the phase-interpolator in the PLL feedback path helps smooth dither jitter. Relative to FIG. 9, the timing relationship of the VFO output signal and the timing reference signal can be modeled by the following equation, assuming zero input from linear phase detection path:

$$T_{ref}=[2*T_{VFO}\pm 2*2*T_{VFO}/2^P(2^K-1)]N/2.$$

Here, it is assumed that the reference clock frequency is tracked and that the period of the feedback timing signal ($T_{ref}$) equals the period of the PLL feedback signal ($T_{fb}$). In addition, in this last equation, the quantity k in $2^K-1$ represents the number of interpolator phase steps per clock cycle, N represents a scaling factor (e.g., programmed to adjust to a variable bit rate of the incoming data signal), and $2^P$ represents total number of phase steps. For example, in a system where eight recovered clock phases are provided to the phase interpolator (i.e., P=8), the phase interpolator can produce 256 discrete phase steps, and if the phase interpolator could jump up or down by two steps in any given clock cycle, the expression $$(2^K-1)/2^P$$

would evaluate to 3/256.

This first equation above reduces to $$T_{ref}=[N*T_{VFO}*(1\pm(2^K-1)/2^P),$$

and $$1/f_{ref}=[N*(1\pm(2^K-1)/2^P)]1/f_{out},$$

and $$f_{out}=[N*(1\pm(2^K-1)/2^P)]f_{ref}.$$

The latter equation above represents smoothing attributable to the use of the phase interpolator in the PLL feedback path, controlled responsive to binary phase detection. What this equation shows is that the PLL output frequency is not necessarily an integer multiple of the reference clock, as it would be for a conventional clock recovery circuit. Rather, generally speaking, the reference clock is offset by a factor set by the resolution of the phase adjustment steps. For example, in a hypothetical implementation where N=32, k=1 (1 permitted phase step per clock cycle), $2^P$=32 and $f_{ref}$=800 MHz, this equation would reduce to $f_{out}$=26.4 GHz, i.e., the output frequency would be offset by 800 ppm from reference clock. This is to say, relative to an implementation representing integer multiplication of the reference clock, e.g., where N=32, and $f_{out}$=32*$f_{ref}$=24.6 GHz, the system of FIG. 9 would produce an output clock that is fractionally offset from the input clock by 800 ppm.

The description presented above has provided examples of a clock recovery circuit with two-point modulation and related methods of operation. As indicated above, these techniques can optionally be employed within a single integrated circuit that receives one or many signaling lanes. A number of optional features have also been described, for example, the use of binary phase detection based on a bang-bang phase detector, a hybrid phase detector, or another specific circuit that generates a binary phase-error output. Similarly, specific examples of linear phase detection have been presented; some of these examples generate a signal having a magnitude that varies linearly with phase error, e.g., a signal can be produced which is not dependent on variable-width pulses but instead has a current or voltage dependent that conveys magnitude of phase deviation. Note that not all embodiments require this specific form of linear phase detection, that is, it is possible that implementations may choose to rely on a variable pulse-width linear phase-error signal, or on longer latency (e.g., filtered) linear response path.

It should be noted that the subject matter disclosed herein can be expressed (or represented), as data and/or instructions embodied in various computer-readable storage media, meaning physical non-transitory media such as computer memory, storage disks and the like. In this context, the described subject matter can take the form of instructions or data for fabricating an integrated circuit that, when built and operated, possesses the circuits and structures, and performs the techniques described herein. An output of a process for designing an integrated circuit, or a portion of an integrated circuit, comprising one or more of the circuits described herein may be such a computer-readable medium such as, for example, a magnetic tape or an optical or magnetic disk, or other non-volatile physical storage. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

In addition, in the foregoing description and in the accompanying drawings, specific terminology and drawing symbols have been set forth to provide a thorough understanding of the disclosed embodiments. In some instances, the terminology and symbols may imply specific details that are not required to practice those embodiments. The terms "exemplary" and "embodiment" are used to express an example, not a preference or requirement.

Various modifications and changes may be made to the embodiments presented herein without departing from the broader spirit and scope of the disclosure. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. An integrated circuit, comprising:
   a receiver to receive a digital signal from a signal path; and
   a clock recovery circuit to generate a recovered clock from the digital signal;
   wherein the clock recovery circuit
      is to receive a first phase detection signal representing a comparison of timing of the digital signal with timing of the recovered clock signal, the first phase detection signal to vary linearly with phase difference,
      is to receive a second phase detection signal representing a binary comparison of the digital signal with timing of the recovered clock signal, and
      comprises a variable frequency oscillator to generate the recovered clock in dependence on each of the first phase detection signal and the second phase detection signal.

2. The integrated circuit of claim 1, wherein:
   the variable frequency oscillator is to generate multiple phases of the recovered clock, the multiple phases respectively separated by constant phase offset;
   the clock recovery circuit further comprises an accumulator to receive the second phase detection signal and accumulate a phase difference, a phase interpolator to receive the multiple phases and to generate an interpolated clock, the phase interpolator controlled in dependence on the accumulated phase difference, and a phase frequency detector to receive the interpolated clock and to compare the interpolated clock with a timing reference to generate an output; and the variable frequency oscillator is further to generate the recovered clock in dependence on an output of the phase frequency detector.

3. The integrated circuit of claim 2, wherein said integrated circuit comprises a connection pin to receive the timing reference as an externally-supplied signal input to said integrated circuit.

4. The integrated circuit of claim 2, wherein the clock recovery circuit further comprises a low pass filter to filter the output of the phase frequency detector, and a charge pump to receive an output of the low pass filter and to responsively generate a control signal having a variable magnitude, the variable frequency oscillator to generate the recovered clock to have a frequency that varies according to the magnitude of the control signal.

5. The integrated circuit of claim 1, wherein the clock recovery circuitry comprises hybrid phase detector circuitry having circuit elements that are to generate both of the first phase detection signal and the second phase detection signal.

6. The integrated circuit of claim 1, wherein the clock recovery circuit comprises linear phase detection circuitry that is to generate the first phase detection signal and binary phase detection circuitry that is to generate the second phase detection signal.

7. The integrated circuit of claim 1, wherein the variable frequency oscillator is to receive a control signal dependent on a sum of (1) an integrated version of the second phase detection signal, and (2) the first phase detection signal, and is to generate the recovered clock independence on the control signal.

8. The integrated circuit of claim 1, wherein:
the clock recovery circuit comprises two feedback loops, including
a first feedback loop dependent on the first phase detection signal, and
a second feedback loop dependent on the second phase detection signal;
the first feedback loop is to respond to changes in timing of the digital signal with a greater loop bandwidth than the second feedback loop.

9. The integrated circuit of claim 8, wherein:
the second feedback loop comprises a second order correction circuit to generate an output that varies according to both of the second phase detection signal and an integral of the second phase detection signal.

10. The integrated circuit of claim 8, wherein the digital signal is adapted to carry timing for a spread spectrum clock signal and wherein:
the second feedback loop comprises a third order correction circuit to generate an output that varies according to all of the second phase detection signal, the integral of the second phase detection signal, and the integral of the integral of the second phase detection signal.

11. The integrated circuit of claim 1, further comprising a continuous time linear equalizer (CTLE), the CTLE to receive an input signal and to equalize the input signal according to frequency of data values carried by the input signal, to generate the digital signal as an equalized version of the input signal.

12. The integrated circuit of claim 1, further comprising a deserializer to receive sampled data values from the receiver, the deserializer controlled dependent on the recovered clock to generate a parallel data word from time-separated symbols carried by the digital signal.

13. The integrated circuit of claim 1, further comprising circuitry to detect a predetermined bit pattern carried by the digital signal, and to restrict updates in the recovered clock responsive to the second phase detection signal to occur responsive to detection of the predetermined bit pattern.

14. An integrated circuit to receive digital signals from respective, external signaling lanes, the integrated circuit comprising:
for each signaling lane, a receiver to receive the respective digital signal; and
a clock recovery circuit to generate a recovered clock from at least one of the digital signals;
wherein the clock recovery circuit
is to receive a first input to receive a first phase detection signal representing a comparison of timing of the at least one of the digital signals with timing of the recovered clock signal, the first phase detection signal to vary linearly with phase difference,
is to receive a second phase detection signal representing a binary comparison of the at least one of the digital signals with timing of the recovered clock signal, and
comprises a variable frequency oscillator to generate the recovered clock in dependence on each of the first phase detection signal and the second phase detection signal.

15. The integrated circuit of claim 14, wherein:
the clock recovery circuit is a first clock recovery circuit; and
the integrated circuit comprises clock recovery circuits that are respective to the signaling lanes, the clock recovery circuits including the first clock recovery circuit, each of the clock recovery circuits
to receive a first phase detection signal representing a comparison of timing the respective digital signal with timing of a respective recovered clock signal, the first phase detection signal to vary linearly with phase difference,
to receive a second phase detection signal representing a binary comparison of the respective digital signal with timing of the respective recovered clock signal, and
comprises a variable frequency oscillator to generate the respective recovered clock in dependence on each of the respective first phase detection signal and the respective second phase detection signal.

16. The integrated circuit of claim 15, wherein the integrated circuit has a first mode, in which each of the clock recovery circuits are to independently generate the respective recovered clock in dependence on the respective digital signal, and a second mode, in which one of the clock recovery circuits is to act as a master, and each other of the clock recovery circuits is to act as a slave to timing updates generated by the master.

17. The integrated circuit of claim 14, wherein:
the variable frequency oscillator is to generate multiple phases of the recovered clock, the multiple phases respectively separated by constant phase offset;
the clock recovery circuit further comprises an accumulator to receive the second phase detection signal and accumulate a phase difference, a phase interpolator to receive the multiple phases and to generate an interpolated clock, the phase interpolator controlled in dependence on the phase difference, and a phase frequency detector to receive the interpolated clock and to compare the interpolated clock with a timing reference; and the variable frequency oscillator is further to generate the recovered clock in dependence on an output of the phase frequency detector.

18. The integrated circuit of claim 17, wherein said integrated circuit comprises a connection pin to receive the timing reference as an externally-supplied signal input to said integrated circuit.

19. The integrated circuit of claim 14, wherein the clock recovery circuit further comprises a low pass filter to filter the output of the phase frequency detector, and a charge pump to receive an output of the low pass filter and to generate a control signal having a variable magnitude, the variable frequency oscillator to generate the recovered clock to have a frequency that varies according to the magnitude of the control signal.

20. The integrated circuit of claim 14, wherein the variable frequency oscillator is to receive a control signal dependent on a sum of (1) an integrated version of the second phase detection signal, and (2) the first phase detection signal, and is to generate the recovered clock independence on the control signal.

21. The integrated circuit of claim 14, wherein:

the clock recovery circuit comprises two feedback loops, including
  a first feedback loop dependent on the first phase detection signal, and
  a second feedback loop dependent on the second phase detection signal;

the first feedback loop is to respond to changes in timing of the at least one of the digital signals with a greater loop bandwidth than the second feedback loop.

22. The integrated circuit of claim 14, further comprising for each signaling lane a continuous time linear equalizer (CTLE), each CTLE to receive an input signal from the respective signaling lane and to equalize the respective input signal according to frequency of data values carried by the respective input signal, to generate the respective digital signal as an equalized version of the respective input signal.

23. The integrated circuit of claim 14, further comprising for each signaling lane:

a deserializer to receive sampled data values from the respective receiver, the deserializer to be controlled dependent on the recovered clock to generate a parallel data word from time-separated symbols carried by the respective digital signal.

\* \* \* \* \*